(12) United States Patent
Cheng et al.

(10) Patent No.: US 10,800,092 B1
(45) Date of Patent: *Oct. 13, 2020

(54) LOW TEMPERATURE ATMOSPHERIC PRESSURE PLASMA FOR CLEANING AND ACTIVATING METALS

(71) Applicant: Surfx Technologies LLC, Redondo Beach, CA (US)

(72) Inventors: Siu Fai Cheng, Culver City, CA (US); Thomas Scott Williams, Los Angeles, CA (US); Toby Desmond Oste, Sydney (AU); Sarkis Minas Keshishian, Sydney (AU); Robert F. Hicks, Los Angeles, CA (US)

(73) Assignee: Surfx Technologies LLC, Redondo Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/042,905

(22) Filed: Jul. 23, 2018

Related U.S. Application Data

(63) Continuation-in-part of application No. 15/196,292, filed on Jun. 29, 2016, now Pat. No. 10,032,609, (Continued)

(51) Int. Cl.
*B29C 59/14* (2006.01)
*H05H 1/24* (2006.01)
(Continued)

(52) U.S. Cl.
CPC ........ *B29C 59/14* (2013.01); *H01J 37/32009* (2013.01); *H01J 37/32174* (2013.01);
(Continued)

(58) Field of Classification Search
CPC .......... H01J 37/32366; H01J 37/32532; H01J 37/32972; H01J 37/32009
(Continued)

(56) References Cited

U.S. PATENT DOCUMENTS 3,437,864 A   4/1969   Kofoid et al.
4,088,926 A   5/1978   Fletcher et al.
(Continued)

OTHER PUBLICATIONS

Inomata et al., Open air deposition of SiO2 film from a cold plasma torch of tetramethoxysilane-H2-Ar system, Appl. Phys. Lett., Jan. 3, 1994, pp. 46-47, 64(1).
(Continued)

*Primary Examiner* — Binh X Tran
(74) *Attorney, Agent, or Firm* — Canady & Lortz LLP; Bradley K. Lortz

(57) ABSTRACT

Plasma applications are disclosed that operate with argon or helium at atmospheric pressure, and at low temperatures, and with high concentrations of reactive species in the effluent stream. Laminar gas flow is developed prior to forming the plasma and at least one of the electrodes can be heated which enables operation at conditions where the argon or helium plasma would otherwise be unstable and either extinguish, or transition into an arc. The techniques can be employed to clean and activate a metal substrate, including removal of oxidation, thereby enhancing the bonding of at least one other material to the metal.

20 Claims, 23 Drawing Sheets

Related U.S. Application Data which is a continuation-in-part of application No. 14/576,106, filed on Dec. 18, 2014, now Pat. No. 9,406,485.

(60) Provisional application No. 61/917,901, filed on Dec. 18, 2013.

(51) Int. Cl.
   *H01J 37/32* (2006.01)
   *H05B 7/16* (2006.01)
   *H05H 1/34* (2006.01)

(52) U.S. Cl.
   CPC .. *H01J 37/32366* (2013.01); *H01J 37/32449* (2013.01); *H01J 37/32532* (2013.01); *H01J 37/32972* (2013.01); *H05B 7/16* (2013.01); *H05H 1/2406* (2013.01); *H05H 1/34* (2013.01); *B29C 2059/145* (2013.01); *H05H 2001/2456* (2013.01)

(58) Field of Classification Search
   USPC ........................................... 216/67, 71
   See application file for complete search history.

(56) References Cited

U.S. PATENT DOCUMENTS

| | | |
|---|---|---|
| 4,434,742 A | 3/1984 | Henaff et al. |
| 5,147,493 A | 9/1992 | Nishimura et al. |
| 5,198,724 A | 3/1993 | Koinuma et al. |
| 5,285,046 A | 2/1994 | Hansz |
| 5,309,063 A | 5/1994 | Singh |
| 5,414,324 A | 5/1995 | Roth et al. |
| 5,789,867 A | 8/1998 | Westendorp et al. |
| 5,961,772 A | 10/1999 | Selwyn |
| 5,977,715 A | 11/1999 | Li et al. |
| 5,997,956 A | 12/1999 | Hunt et al. |
| 6,204,605 B1 | 4/2001 | Laroussi et al. |
| 6,262,523 B1 | 7/2001 | Selwyn et al. |
| 6,465,964 B1 | 10/2002 | Taguchi et al. |
| 6,659,110 B2 | 12/2003 | Forsnel et al. |
| 6,730,238 B2 | 5/2004 | Li et al. |
| 7,329,608 B2 | 2/2008 | Babayan et al. |
| 8,328,982 B1 | 12/2012 | Babayan et al. |
| 9,406,485 B1 * | 8/2016 | Cheng ............... H01J 37/32183 |
| 10,032,609 B1 * | 7/2018 | Cheng ............... H01J 37/32183 |
| 2001/0006093 A1 | 7/2001 | Tabuchi et al. |
| 2002/0008480 A1 | 1/2002 | Yamazaki et al. |
| 2002/0129902 A1 | 9/2002 | Babayan et al. |
| 2006/0156983 A1 | 7/2006 | Penelon et al. |
| 2010/0190098 A1 | 7/2010 | Walker et al. |
| 2010/0261302 A1 | 10/2010 | Rana et al. |
| 2010/0304146 A1 * | 12/2010 | Krebs ................. C23C 16/4415 428/409 |
| 2014/0054269 A1 * | 2/2014 | Hudson ............ H01J 37/32091 216/67 |

OTHER PUBLICATIONS

Koinuma et al., Development and application of a microbeam plasma. generator, Appl. Phys. Lett., Feb. 17, 1992, pp. 816-817, 60(7).

* cited by examiner

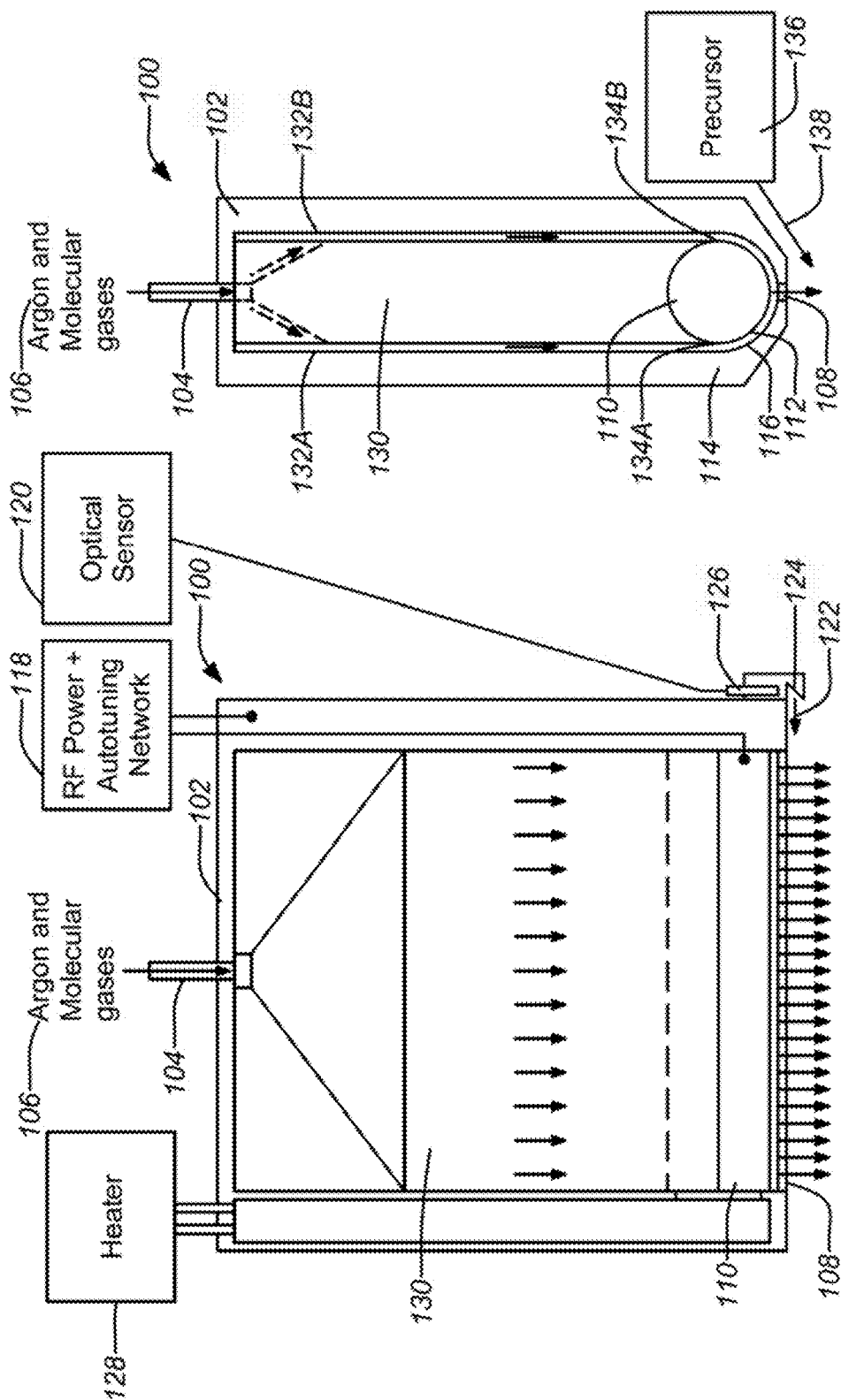

LOW TEMPERATURE ATMOSPHERIC PRESSURE PLASMA FOR CLEANING AND ACTIVATING METALS

CROSS-REFERENCE TO RELATED APPLICATIONS

This continuation-in-part application claims the benefit under 35 U.S.C. § 119 of the following co-pending and commonly assigned U.S. utility patent application:

U.S. patent application Ser. No. 15/196,292, filed Jun. 29, 2016 (now U.S. Pat. No. 10,032,609), which application claims the benefit of U.S. patent application Ser. No. 14/576,106, filed Dec. 18, 2014 (now U.S. Pat. No. 9,406,485, issued Aug. 2, 2016) and entitled "ARGON PLASMA APPARATUS AND METHODS," by Cheng et al. which application claims the benefit of U.S. Provisional Patent Application No. 61/917,901, filed Dec. 18, 2013, and entitled "ARGON PLASMA APPARATUS AND METHODS", by Cheng et al., which applications are both incorporated by reference herein.

BACKGROUND OF THE INVENTION

1. Field of the Invention

The invention is related to plasma apparatus and methods of using the plasma apparatus for cleaning, surface activation, etching and thin-film deposition and particularly to using the plasma apparatus for the cleaning and activation of metals.

2. Description of Related Art

Ionized gas plasmas have found wide application in materials processing. Plasmas that are used in materials processing are generally weakly ionized, meaning that a small fraction of the molecules in the gas are charged. In addition to the ions, these plasmas contain reactive species that can clean, activate, etch and deposit thin films onto surfaces. The temperature in these weakly ionized gases is usually below 250° C., so that most thermally sensitive substrates are not damaged. The physics and chemistry of weakly ionized plasmas are described in several textbooks. See for example, Lieberman and Lichtenberg, "Principles of Plasma Discharges and Materials Processing", (John Wiley & Sons, Inc., New York, 1994), and Raizer, Y. P., "Gas Discharge Physics", (Springer-Verlag, Berlin (1991).

According to the literature, weakly ionized plasmas are generated in vacuum at pressures between 0.001 and 1.0 Torr (see Lieberman and Lichtenberg (1994)). Electrical power is applied across two electrodes to break the gas down and ionize it. The electricity may be provided as a direct current (DC), alternating current (AC), radio frequency (RF), or microwave (MW) source. The electrode may be constructed to provide either capacitive or inductive coupling to strike and maintain the plasma. In the former case, two conducting electrodes are placed inside the vacuum chamber filled with a small amount of gas. One of the electrodes is powered, or biased, by the RF generator, while the other one is grounded. In the latter case, the RF power is supplied through an antenna that is wrapped in a coil around the insulating walls of the chamber. The oscillating electric field from the coil penetrates into the gas inducing ionization.

Over the past fifteen years, atmospheric pressure plasmas have been developed as an alternative to vacuum plasmas. These plasmas can treat an object of any size and shape, since they do not have to be loaded into a vacuum chamber. This can significantly reduce the cost of the process. A number of different atmospheric pressure plasma devices have been developed (Schutze, et. al., "The atmospheric-pressure plasma jet: A review and comparison to other plasma sources", IEEE Trans. Plasma Sci. 26, 1685-1694 (1998). These plasmas are governed by how the ionization process is controlled. At atmospheric pressure, the gas density is so high that the ionization reaction can easily run away and generate a high temperature arc, which is not useful for materials processing.

There are three common types of atmospheric pressure plasmas used to treat materials. These include a dielectric barrier discharge (DBD), a torch, and a radio-frequency, noble gas discharge. The DBD has long been employed to treat rolls of plastic film whereby the material is continuously passed between the electrodes. In some instances, the DBD may be deployed as a downstream device, so that 3-D objects can be treated with the reactive gasses that flow out from between the electrodes. The torch and the RF noble-gas discharge are strictly downstream plasmas. Here, the ions and electrons are confined to the gap between the electrodes, and the substrate is exposed to a beam of neutral reactive species that exits from the source. A robot is used to scan the plasma beam over the substrate surface, which is positioned <1 cm below the plasma. In contrast to vacuum plasmas, only the area on the sample surface requiring treatment is exposed to the reactive gas species.

The dielectric barrier discharge is usually operated with air (See Goldman and Sigmond, "Corona and Insulation." *IEEE Transactions on Electrical Insulation*, E1-17, no. 2, 90-105 (1982) and Eliasson and Kogelschatz, "Nonequilibrium Volume Plasma Chemical Processing", *IEEE Transactions on Plasma Science*, 19, 1063-1077, (1991)). A 10 KV power supply operating at approximately 20 KHz supplies the voltage necessary to breakdown the gas. A dielectric barrier covers one of the electrodes, and prevents a high current arc from forming. During operation charges build up on the surface of the insulator and discharge as tiny "micro-arcs" within each AC cycle. The micro-discharges occur randomly in space and time, lasting for periods of 10 to 100 ns. Inside the micro-discharge, the electron density is high, whereas outside it is extremely low. Consequently, it is not possible to measure an average electron density and electron temperature for the entire gas volume between the electrodes. Note that substrates placed downstream of the DBD will not be treated uniformly with the plasma on the micro scale. In addition, the discharge can interact electrically with the substrate, making it difficult to treat components containing metals.

The torch is generated by forming an arc between closely spaced powered and grounded electrodes. This construct is described by Fauchais and Vardelle, in their article: "Thermal Plasmas", *IEEE Transactions on Plasma Science*, 25, 1258-1280 (1997). Air is passed between the electrodes, and ionized by applying 10 kV AC power. The arc is a thermal plasma in which the neutral temperature is many thousands of degrees. Nevertheless, it is possible to blow gas through the arc at a sufficient velocity such that the overall gas temperature is low enough to treat thermally sensitive materials, including polymers. The Plasmaflume™ by Plasma-Treat is an example of this type of construct. It utilizes a rotating, cone-shaped electrode that rapidly spins the arc through the flowing gas volume, maintaining the average neutral temperature below 700 K. Plasma streamers shoot out the end of the housing and treat objects placed a short distance below.

Atmospheric pressure, noble gas plasmas, driven with radio-frequency power at 13.56 or 27.12 MHz, operate in a different way than the DBD and torch plasmas. These plasmas, sometimes referred to as atmospheric pressure plasma jets (APPJ), are weakly ionized, capacitive discharges (see Jeong et al., "Etching Materials with an Atmospheric-Pressure Plasma Jet," *Plasma Sources Science Technol.,* 7, 282-285 (1998); Babayan et al., "Deposition of Silicon Dioxide Films with an Atmospheric-Pressure Plasma Jet," *Plasma Sources Science Technol.,* 7, 286-288, (1998); Moravej, et al., "Physics of High-Pressure Helium and Argon Radio-Frequency Plasmas", J. Appl. Phys., vol. 96, p. 7011 (2004); Babayan and Hicks, U.S. Pat. No. 7,329,608, Feb. 12, 2008, and Babayan and Hicks, U.S. Pat. No. 8,328,982, Dec. 11, 2012). The ions and electrons uniformly fill the gas volume between the metal electrodes, with a collisional sheath forming at the boundaries to repel the electrons and maintain the plasma. The average electron density and temperature in the RF, noble gas plasma has been determined to be $10^{11}$ to $10^{12}$ cm$^{-3}$ and 1 to 2 eV, respectively. Depending on the RF power level, the neutral gas temperature ranges from 323 to 573 K. Molecular gases are fed with the helium or argon at concentrations from 2.0 to 5.0 volume %.

Non-thermal argon plasmas can be generated at atmospheric pressure as well (see Moravej, et al., "Physics of High-Pressure Helium and Argon Radio-Frequency Plasmas", J. Appl. Phys., vol. 96, p. 7011 (2004). However, they are much more difficult to stabilize than the helium discharge for several reasons. The cross section is large, comparable to that of nitrogen and oxygen, yielding a fast rate of ionization. Secondly, the mass of argon is twenty times greater than helium, which reduces the electron mobility in the gas. In order to maintain a reasonable current through the argon discharge, the electron density must be pushed to a value greater than $10^{12}$ cm$^{-3}$, where the plasma transitions from alpha- to gamma-mode ionization and becomes unstable (see Yang, et al., "Comparison of an Atmospheric Pressure, Radio-Frequency Discharge Operating in the Alpha and Gamma Modes", Plasma Sources Sci. Technol., vol. 14, p. 314 (2005); and Shi and Kong, "Mechanisms of the Alpha and Gamma Modes in Radio-Frequency Atmospheric Glow Discharges", J. Appl. Phys., vol. 97 (2005)).

In view of the foregoing, there is a need for an atmospheric pressure argon plasma that operates in a stable mode with a uniform distribution of the ionized gas over the discharge volume. Further there is a need for such devices and methods for a plasma that remains stable during operation over a wide range of conditions and with different gases. Such a plasma apparatus should provide higher fluxes of reactive species to increase the speed with which materials are processed, and may be rapidly scanned over surfaces to treat parts that are large and/or three dimensional, and are not easily processed in a vacuum chamber. These and other needs are met by embodiments of the present invention as described hereafter.

SUMMARY OF THE INVENTION

One embodiment of the invention comprises an atmospheric pressure plasma apparatus that utilizes argon or helium and other molecular gases to clean, activate, etch and deposit thin films on materials. The plasma is generated in a self-contained housing that contains two electrodes driven with radio frequency power. A high density of reactive species is generated within the device by collisions between molecules and the energetic free electrons in the discharge. These species flow out of the housing and onto a substrate that is placed a short distance downstream. In one embodiment of the invention an integrated UV-visible spectroscopy system is used to monitor the plasma species being produced at the exit of the plasma source. In another embodiment, the temperature of the plasma source is controlled using a heat exchange liquid, including deionized water, which is pumped through the plasma source's active electrodes (i.e. ground and power electrodes) at a constant rate. In another embodiment, an auto-tuning matching network is employed to strike the argon plasma and sustain it during operation. One embodiment of the invention employs an algorithm to automatically control two variable capacitors, so that they can maintain the radio-frequency matching in spite of the large difference in impedance between striking the discharge and operating it at steady state conditions.

In one embodiment of the invention, contaminated surfaces are cleaned through exposure to the reactive gas species generated by the plasma. To remove organic contamination, oxygen is added to the argon or helium gas before entering the plasma housing. The plasma then converts the oxygen molecules into O atoms and other reactive species. This gas flow is directed onto the surface to be cleaned. A method of demonstrating this process is to clean soot generated by the laser ablation processes from patterned composite materials. The fouled surface is then exposed to a mixture of argon and oxygen plasma or helium and oxygen plasma using the embodiments described. The substrate is exposed to the reactive oxygen species generated in the argon/oxygen plasma for a sufficient period of time to cause organic contamination to be removed as volatile etch products.

In another embodiment of the invention, the reactive gas is used to increase the surface energy and promote adhesion. In such a case, hydrogen, oxygen, nitrogen, fluorine or chlorine is added to argon or helium before entering the plasma source. When the RF power is applied, the gas mixture will be ionized creating a flux of reactive species. These reactive species exit the plasma housing, impinge on the substrate and cause its surface to be chemically modified. A flux of oxygen atoms is generated by feeding oxygen and argon or oxygen and helium into the plasma apparatus. A method of activating a surface and promoting adhesion is to place a polymer and composite surface downstream of the gas flowing out of the plasma housing. The temperature-controlled plasma effluent contains reactive oxygen species (i.e. ground state O atoms, metastable oxygen molecules and ozone) and neutral argon or helium species that impinge on the sample surface. This avoids ion bombardment or electrical arcing, which may damage some substrates. In addition, the process may be performed at ambient pressure and at low temperature so that a chamber and vacuum pumps are not needed and sensitive substrates are not thermally damaged.

In another embodiment of the invention, the reactive gas is used for etching materials including metals, metal oxides, polymers, semiconductors or ceramics. In the case of etching metals, semiconductors or ceramics, a gas containing a halogen including chlorine or fluorine is added to the argon or helium. When the RF power is applied, the gas will be ionized creating a flux of fluorine or chlorine atoms capable of etching the substrate. For example, carbon tetrafluoride, added to the process gas stream will disassociate to produce fluorine atoms, which can etch the substrate downstream. The etch products generated are metal halides which are volatile and are removed from the surface. Polymers and organic materials can be etched by adding oxygen to the plasma gas and generating $CO_2$ and water as volatile etch products. Oxidized metal surfaces can be removed by adding hydrogen to the plasma gas. In this case, the etch product is water vapor.

In another embodiment of the invention, the reactive gas from the plasma is used to clean and activate metal substrates, so that for example, the bonding of other materials to the metal surface is improved. Metals are cleaned by contacting the surface with a plasma that is fed with oxygen, nitrogen, or hydrogen and argon or helium. The oxygen and argon plasma is highly effective for activating metal surfaces for bonding. If the metal is oxidized and covered with a layer of metal oxide, then the metal oxide layer may be removed by exposure to the hydrogen and argon plasma. Metals that may be cleaned and activated for adhesion include, but are not limited to, gold, silver, copper, platinum, palladium, nickel, indium, gallium, aluminum, lead, tin, iron and alloys thereof.

A typical embodiment of the method of cleaning a metal surface, comprises the steps of directing gas flow at atmospheric pressure comprising argon or helium and at least one molecular gas of oxygen, nitrogen and hydrogen from an inlet through a laminar flow path within a housing to an outlet for plasma comprising reactive neutral species, directing the laminar gas flow within the housing between a surface of a powered electrode and a surface of a grounded electrode, the grounded electrode surface closely spaced from the powered electrode surface, delivering radio frequency power coupled to the powered electrode and the grounded electrode from a power supply to ionize species in the laminar gas flow and produce the plasma comprising the reactive neutral species, and directing the generated reactive neutral species from a head to the metal surface. The plasma can be maintained at less than 100 C. The metal surface can be cleaned by the reactive species directed from the head. The metal surface can be cleaned with the plasma in an oxygen free environment. The metal surface can obtain increased surface energy by the reactive species directed from the head. The metal surface can comprise at least one element from the group consisting of gold, silver, copper, platinum, palladium, nickel, indium, gallium, aluminum, lead, tin, and iron. Typically, the housing can comprise the grounded electrode.

In some embodiments, the gas flow can comprise argon and hydrogen where metal oxide on the metal surface is removed by the reactive species directed from the head to the metal surface. In this case, the plasma can comprise hydrogen at a partial pressure of at least 10 Torr with argon or helium. The hydrogen can be below 2.0 volume % and the argon is a balance of the gas flow. In addition, the metal oxide on the metal surface can be removed by the reactive species directed from the head. In addition, the metal surface (with the plasma directed from heated a heated electrode or directly heated through any known suitable means) can be heated to increase a rate of metal oxide reduction.

Further embodiments can include receiving optical spectroscopy information of the plasma comprising the reactive neutral species at the outlet with an optical sensor. The optical spectroscopy information can be reflected off a mirror at one end of the outlet. Further embodiments can also include heating at least one of the powered electrode and the grounded electrode as the laminar gas flow is directed between the powered electrode surface and the grounded electrode surface. Heating can comprise circulating heated liquid through a hollow space within the powered electrode.

As with other embodiments, the flow path can be formed by a flow insert disposed within a chamber within the housing, the flow insert directs the gas flow from the inlet to two opposing walls of the chamber and then to two opposite sides of the powered electrode surface. The powered electrode surface can comprise part of a cylindrical surface and the laminar gas flow is directed circumferentially along the part of the cylindrical surface. In addition, embodiments can further comprise impedance matching the radio frequency power supply to the plasma using a logic algorithm that drives towards a forward power set point while minimizing reflected power as the plasma moves from strike conditions at a higher voltage to run conditions at a lower voltage. Also, in some instances, the molecular gas can be added to the argon or helium gas flow at a concentration between 0.1 to 5.0 volume % and the molecular gas dissociates into atoms inside the plasma, and then flows out of the outlet, wherein the atoms are selected from the group consisting of O, N, H, F. C and S atoms.

Another embodiment of the invention comprises an apparatus and method for depositing thin films. A suitable precursor molecule is selected so that its reaction products will generate the desired coating. In this case, oxygen, nitrogen, hydrogen or another gas can be added to the argon or helium before entering the plasma source. When the RF powered plasma device creates a flux of reactive species including for example, oxygen, nitrogen, or hydrogen atoms. The precursor can be mixed with the reactive gas stream after exiting the plasma source. The resulting mixture then impinges on a substrate where deposition of the film occurs. For example, with an oxygen and argon or oxygen and helium feed to the plasma, a high flux of oxygen atoms is created when the RF power is applied. The addition of tetramethyl-cyclotetrasiloxane downstream of the plasma will result in the deposition of glass (silicon dioxide) films on the substrate.

In one notable example embodiment, an apparatus for producing a low-temperature, atmospheric pressure plasma, comprises a housing having an inlet for gas flow comprising argon or helium and one or more molecular gases, an outlet for plasma comprising reactive neutral species, and a flow path within the housing for directing the gas flow to become laminar, a power electrode disposed within the housing having a powered electrode surface exposed to the laminar gas flow, a ground electrode disposed adjacent to the powered electrode such that a ground electrode surface is closely spaced from the powered electrode surface and the laminar gas flow is directed therebetween, a power supply for delivering radio frequency power coupled to the powered electrode and the ground electrode to ionize the laminar gas flow and produce the plasma comprising the reactive neutral species, and a heater for heating at least one of the powered electrode and the ground electrode as the laminar gas flow is directed between the power electrode surface and the ground electrode surface. Typically, the housing can comprise the grounded electrode and/or the outlet can comprise a linear opening. Typically, the heater can heat to a temperature between 30 and 200 C, and preferably between 40 and 80 C. The heater can comprise heated liquid circulated through a hollow space within the power electrode.

In some embodiments, the flow path can be formed by a flow insert disposed within a chamber within the housing, the flow insert directs the gas flow from the inlet to two opposing walls of the chamber and then to two opposite sides of the powered electrode surface. In addition, the powered electrode surface can comprise part of a cylindrical surface and the laminar gas flow is directed circumferentially along the part of the cylindrical surface.

Further embodiments can include an optical sensor for receiving optical spectroscopy information of the argon or helium plasma comprising the reactive neutral species at the outlet. The optical spectroscopy information can be from a line of sight along the linear opening. Further the optical spectroscopy information can be reflected off a mirror at one end of the linear opening.

In further embodiments, the power supply can include an auto-tuning network is used that impedance matches the radio frequency power supply to the plasma, wherein said auto-tuning network follows a logic algorithm that drives towards a forward power set point while minimizing reflected power, and does so as the plasma moves from strike conditions at a higher voltage to run conditions at a lower voltage.

Also in further embodiments, the molecular gas can be added to the argon or helium gas flow at a concentration between 0.1 to 5.0 volume % and the molecular gas dissociates into atoms inside the plasma, and then flows out of the outlet, wherein the atoms are selected from the group consisting of O, N, H, F, C and S atoms.

In a similar manner, a method embodiment of the invention comprises the steps of directing gas flow comprising helium or argon and one or more molecular gases from an inlet through a laminar flow path within a housing to an outlet for plasma comprising reactive neutral species, directing the laminar gas flow within the housing between the surface of a powered electrode and the surface of a grounded electrode, the grounded electrode surface closely spaced from the powered electrode surface, delivering radio frequency power coupled to the powered electrode and the grounded electrode from a power supply to ionize species in the laminar gas flow and produce the plasma comprising the reactive neutral species, heating at least one of the powered electrode and the grounded electrode as the laminar gas flow is directed between the powered electrode surface and the grounded electrode surface, and directing the generated reactive neutral species from a head to a material surface.

The material surface can be cleaned or etched by the reactive neutral species directed from the head. Alternately (or in addition), the material surface can obtain increased surface energy by the reactive neutral species directed from the head. This can improve adhesion properties of the material surface. The material surface can also have a thin film deposited thereon by the reactive neutral species directed from the head. A chemical precursor can be mixed with the reactive species directed from the head causing at least one element from the chemical precursor to be incorporated into the thin film deposited on the material surface. This method embodiment of the invention can be further modified consistent with any of the apparatus or method embodiments described herein.

Another embodiment of the invention can also comprise an apparatus for producing a low-temperature, atmospheric pressure argon or helium plasma, including a housing having an inlet for gas flow comprising argon or helium and one or more molecular gases, an outlet for argon or helium plasma comprising reactive neutral species, and a flow path within the housing for directing the gas flow to become laminar, a power electrode disposed within the housing having a power electrode surface exposed to the laminar gas flow, a ground electrode disposed adjacent to the power electrode such that a ground electrode surface is closely spaced from the power electrode surface and the laminar gas flow is directed therebetween, a heater for heating at least one of the power electrode and the ground electrode as the laminar gas flow is directed between the power electrode surface and the ground electrode surface, and a laminar flow insert disposed within a chamber within the housing for forming the flow path, the laminar flow insert directs the gas flow from the inlet to two opposing walls of the chamber and then to two opposite sides of the power electrode surface, wherein a radio frequency power coupled to the power electrode and the ground electrode can ionize the laminar gas flow and produce the argon or helium plasma comprising the reactive neutral species. This apparatus embodiment of the invention can be further modified consistent with any of the apparatus or method embodiments described herein.

These and other embodiments of the invention will become apparent to those skilled in the art from the following description including the preferred embodiments. Embodiments of the invention includes methods to clean surfaces, methods to increase surface energy and improve adhesion, methods for etching materials, and methods for depositing thin films. In addition, embodiments of the invention also include a novel tuning algorithm that uses proportional, integral and differential (PID) feedback control to maintain an impedance match (e.g. 50 ohms) between the amplifier and the plasma source. Embodiments can include a plasma head as a handheld tool that can perform all these methods, by a person sweeping the device over the surface of the material.

BRIEF DESCRIPTION OF THE DRAWINGS

Referring now to the drawings in which like reference numbers represent corresponding parts throughout:

FIGS. 1A and 1B are schematic diagrams of an exemplary Argon plasma apparatus embodiment of the invention;

DETAILED DESCRIPTION INCLUDING THE PREFERRED EMBODIMENTS

Overview

Figure 1C:
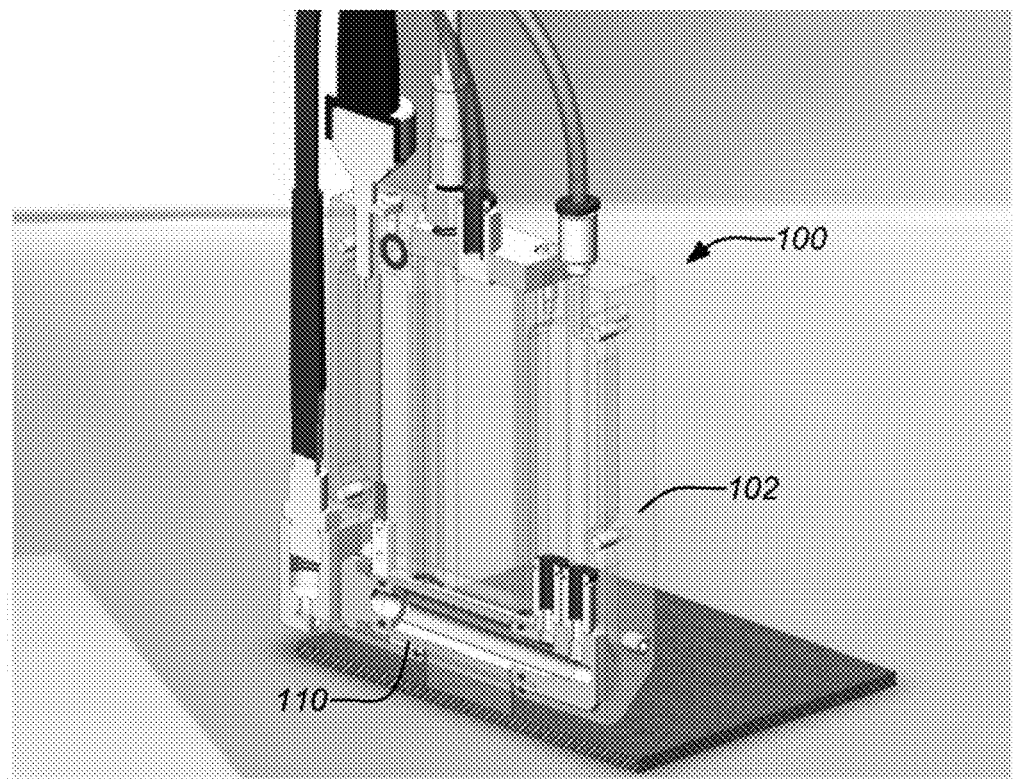
FIGS. 1C and 1D show example cross sections of an example Argon plasma apparatus and power electrode heating.

As described above, plasma applications are disclosed that operate with helium or argon at atmospheric pressure, and at low temperatures, and with high concentrations of reactive species in the effluent stream. Laminar gas flow is developed prior to forming the plasma and at least one of the electrodes is heated which enables operation at conditions where the helium plasma would otherwise be unstable and either extinguish, or transition into an arc. The techniques can be employed to remove organic materials from a substrate, thereby cleaning the substrate; activate the surfaces of materials thereby enhancing adhesion between the material and an adhesive; kill microorganisms on a surface, thereby sterilizing the substrate; etches thin films of materials from a substrate, and deposit thin films and coatings onto a substrate.

The example method of produces a low-temperature, atmospheric pressure, argon plasma by flowing a mixture of argon and molecular gases through a housing containing two closely spaced electrodes, applying radio frequency power to one of the electrodes (grounding the other) sufficient to strike and maintain the ionized gas plasma, and flowing reactive neutral species out of the housing, while keeping the free electrons and ionized inside the housing between the electrodes.

FIGS. 1A and 1B are schematic cross section diagrams of an exemplary Argon plasma device 100 according to an embodiment of the invention for producing a low-temperature, atmospheric pressure argon plasma. The device 100 comprises a housing 102 which supports an inlet 104 for gas flow comprising argon and one or more molecular gases 106 and an outlet 108 for argon plasma comprising reactive neutral species. Typically, the molecular gas is added to the Argon gas flow at a concentration between 0.1 to 5.0 volume %. The molecular gas dissociates into atoms (O, N, H, F, C or S atoms) inside the argon plasma and then flows out of the outlet, e.g. onto a substrate. In this example, the outlet 108 comprises a linear opening.

A flow path within the housing 102 directs the gas flow to become laminar as it moves from the inlet 104 toward a power electrode 110. The power electrode 110 disposed within the housing has a power electrode surface 112 exposed to the laminar gas flow. A ground electrode 114 is disposed adjacent to the power electrode 110 such that a ground electrode surface 116 is closely spaced from the power electrode surface and the laminar gas flow is directed therebetween. In this example, the entire housing 102 is the ground electrode 114. However, those skilled in the art will understand that the ground electrode 114 can be implemented as a separate component in the region near the ground electrode surface 116. It is only necessary that the power and ground electrodes 110, 114 are electrically isolated from one another as will be readily understood by those skilled in the art.

A power supply 118 for delivering radio frequency power is coupled to both the power electrode and the ground electrode to ionize the laminar gas flow and produce the argon plasma comprising the reactive neutral species as it passes between the electrode surfaces 112, 116. In addition, a heater 128 is coupled to the device 100 for heating one or both of the power electrode 110 and the ground electrode 114 as the laminar gas flow is directed between the surfaces 112, 116. The heater 128 heats to a temperature between 40 and 200 C, but preferable between 40 and 80 C. Heating can be implemented through any suitable means however, in the example device 100, the heater 128 comprises heated liquid circulated through a hollow space within the power electrode 110. This is further described in reference to FIGS. 1C and 1D below.

The powered electrode can be coated with a non-metallic, non-conducting material between 1 and 100 microns thick. The dielectric coating on the power electrode can be a hard, high temperature, non-porous coating such as glass ($SiO_2$), alumina ($Al_2O_3$), aluminum nitride (AlN), or similar inorganic electrical insulator. Note that reference to the "power electrode surface" is still applicable if such a coating exist on the power electrode; direct physical contact between the conducting electrodes and the gas flow is not required as will be understood by those skilled in the art.

This example device 100 also employs an optical sensor 120 for receiving optical spectroscopy information of the argon plasma comprising the reactive neutral species at the outlet 108. In this example the optical spectroscopy information is from a line of sight 122 along the linear opening of the outlet 108 allowing for measurement of all exiting plasma as detailed in the following sections. In addition, the device 100 employs a mirror 124 at one end of the linear opening for reflecting the optical spectroscopy information into the fiber optic feed 126 to the sensor 120.

In the device 100, the flow path is formed by a laminar flow insert 130 disposed within a chamber within the housing 102. The laminar flow insert 130 directs the gas flow from the inlet 104 to two opposing walls 132A, 132B of the chamber (while spreading each half of the gas flow to be the width of the outlet 108) and then to two opposite sides 134A, 134B of the power electrode surface 112. The flow insert can be manufactured of a high temperature, insulating material that is resistant to plasma etching including thermoplastics such as PEEK, perfluoroelastromers such as Kalrez or Viton, fluoropolymers such as Teflon, or ceramics such as alumina. The power electrode surface 112 comprises part of a cylindrical surface and the laminar gas flow is directed circumferentially along the part of the cylindrical surface toward the outlet 108. In this case the bifurcated gas flow converges at the outlet 108 as plasma after being ionized between the electrode surfaces 112, 116. The laminar flow insert 130 is further detailed hereafter with reference to FIGS. 12 and 13. Use of such a laminar flow insert 130 allows different flow paths for different applications (e.g. using different outlets shapes) to be configured into an alternate insert which can then directly replace the insert 130 in the device chamber.

The power supply 118 can also include an auto-tuning network that impedance matches the radio frequency power supply to the argon plasma. In addition, the auto-tuning network follows a logic algorithm that drives towards a forward power set point while minimizing reflected power, and does so as the argon plasma moves from strike conditions at a higher voltage to run conditions at a lower voltage. For example 50 ohm impedance matching can be employed. Further details regarding implementation of the algorithm are provided hereafter. Such an algorithm can be readily implemented by those skilled in the art without undue experimentation.

Figure 1D:
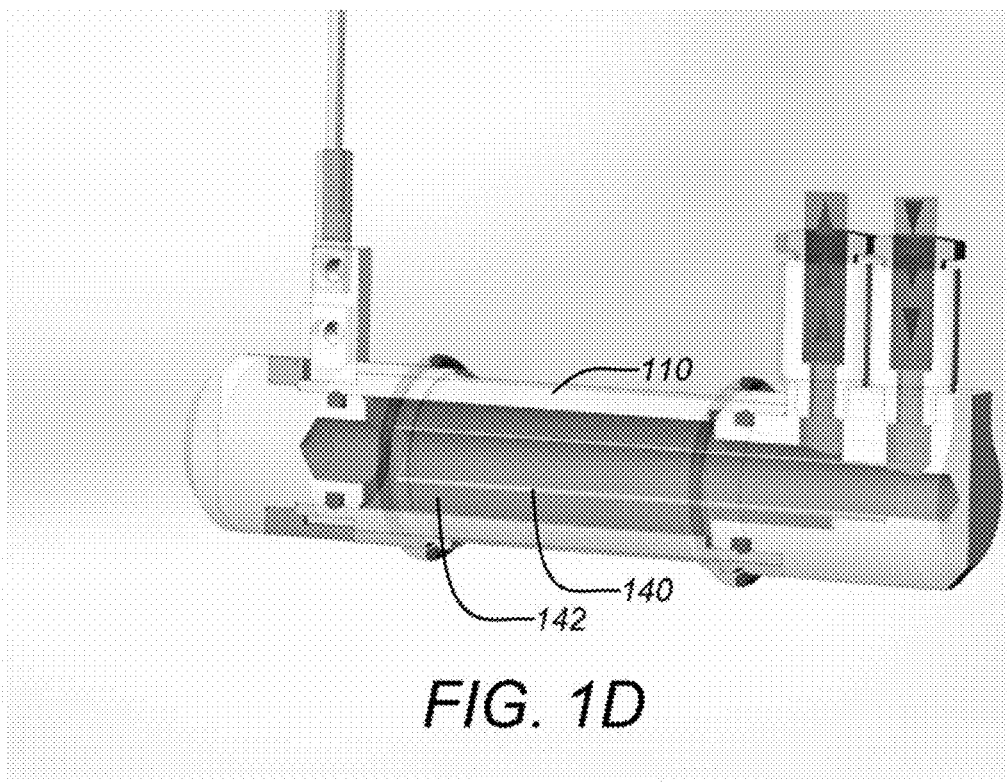
Figure 1F:
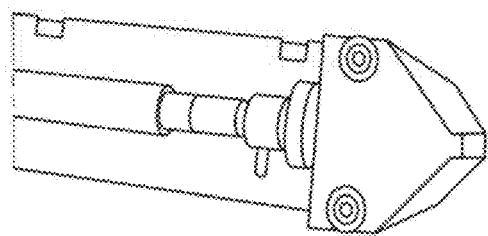
FIGS. 1E-1H shows and exemplary Argon plasma apparatus with OES sensor for in-situ plasma characterization.
Figure 1H:
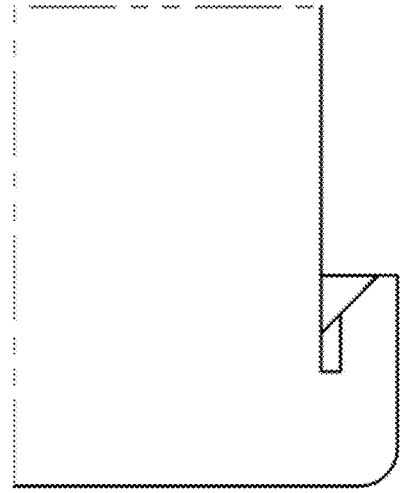
Figure 1E:
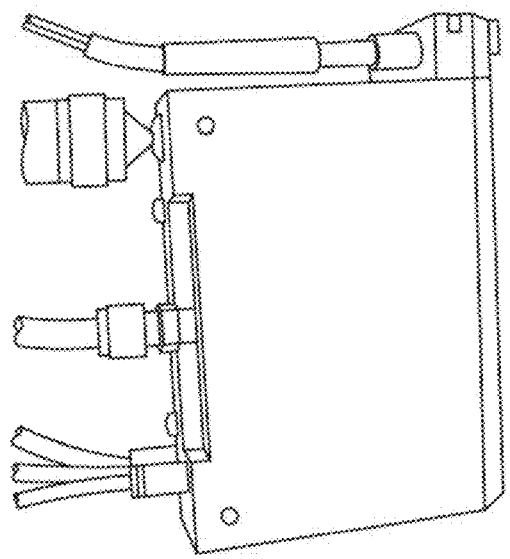
Figure 1G:
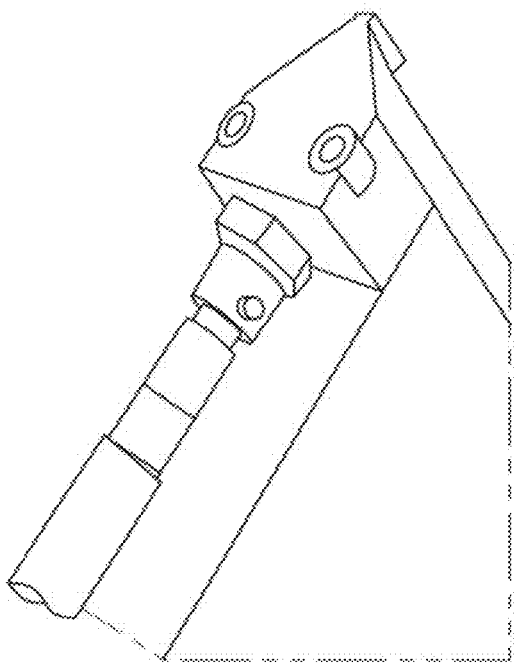

FIGS. 1C and 1D show example cross sections of the example Argon plasma device 100 and the power electrode 110 heating. In this case, heating is provided by circulating heated liquid (e.g. water or any other suitable heat transfer fluid) through a hollow space within the power electrode 110. In this case, the heated liquid is directed through a central tube 140 within the cylindrical power electrode 110. The heated liquid exits the tube 140 at the far end of the electrode 110 and then returns in the annular space 142 between the tube 140 and the interior wall of the electrode 110 thereby transferring heat energy to the electrode 110. It should be noted that the flow direction could alternately be reversed such that the heated liquid enters the annular space 142 first and then returns through the central tube 140.

Finally, the device 100 can also be utilized with a precursor device 136 external to the housing 102. The precursor device 136 introduces a linear beam 138 of volatile chemical precursor(s) into the reactive plasma flow near the outlet 108, e.g. so as to enable the deposition of a thin film onto a substrate placed a short distance downstream. The shape of the precursor outlet can match that of the plasma outlet. For example, for a 1" linear plasma source outlet, the precursor outlet is also a 1" slit but oriented such that the gas exiting from the precursor outlet enters into the plasma gas stream exiting the source (e.g. can be perpendicular to, or at 45 degrees to, etc). Typical chemical precursors include tetraethyl orthosilicate, tetramethylcyclotetrasiloxane, trimethylsilane, and other organosilanes or organometallics.

The example device 100 may be further modified or used in process according to the detailed examples in the following sections as will be understood by those skilled in the art. Some example, applications for the devices and methods described herein include, without limitation, cleaning a material surface, activating a material surface for wetting, activating a material surface for adhesion, sterilizing a material, depositing a thin film onto the substrate, depositing a thin glass film onto the substrate, etching a thin layer of material off of a substrate and etching a metal oxide layer, such as copper oxide, off of a substrate.

Integrated UV-Visible Spectroscopy

Optical emission spectroscopy (OES) is an important tool to characterize plasma discharges. Conventional implementation of OES probes is to position the light sensor/collector inside the plasma. This has many disadvantages because the interaction of the excited species with the free electrons in the discharge makes it difficult if not impossible to interpret the spectrum, and relate it to the performance of the plasma for materials processing. In an example embodiment of invention, the OES probe is placed at the exit where the reactive gas flows out of the housing containing the plasma. This afterglow regime has no significant interactions of the excited species with the free electrons, because the free electron concentration is negligible. Therefore, the reactions that produce the optical emission are straightforward to assess and relate to the performance of the plasma for materials processing. In this embodiment, the OES probe views across the beam of reactive species right at the exit to the plasma source. The OES probe is positioned such that the plasma source may be brought within close proximity (i.e. <1 cm) of the sample undergoing treatment.

Monitoring the plasma species being produced while the plasma is actively treating samples is uniquely useful as it guarantees the user that active species are being produced during the treatment. Moreover, one can tune the plasma with respect to the OES emission instead of using the forward and reflected power. This fact is especially important as different plasma species may be produced at non-ideal electrical match points (i.e. higher reflected power, lower forward power, or both). Thus, tuning based on optical emission gives the user a reliable method of ensuring the desired plasma species are being created and emitted from the plasma source.

In one embodiment of the invention the OES probe is constructed for in-situ monitoring of the optical emission from the afterglow of the plasma. A custom detector fixture has been fabricated with appropriate optics so that the plasma emission can be collected without having to place the sensor parallel to and directly opposite the plasma emission direction. This fixture with the detector affixed is shown from several perspectives in FIGS. 1E-1H.

Figure 2:
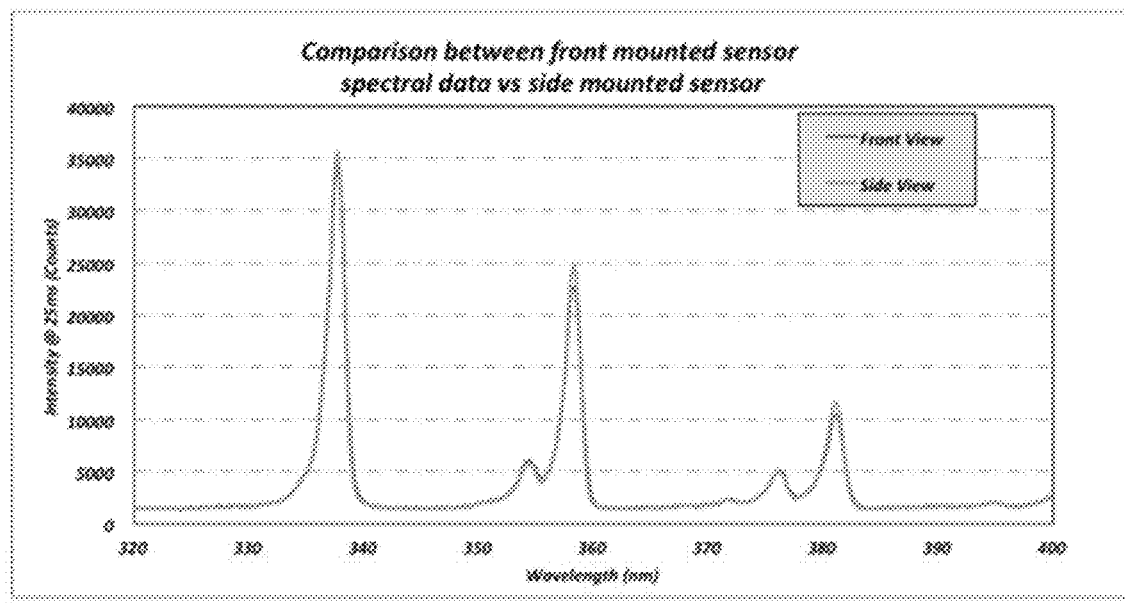
FIG. 2 is a plot of optical emission spectra about metastable nitrogen emission line at 336 nm collected using front view and side view OES sensor implementations.

A zero-filter optical mirror is placed at approximately 45 degrees to the surface normal and allows the emission from the plasma to be detected even when the source is <4 mm from the sample surface. Note that part of the fixture is machined into the plasma source itself. This is done to ensure that both the fixture and the sensor are temperature controlled. Spectra were taken on an argon-nitrogen plasma using this fixture and compared to the identical plasma characterized with the detector parallel to and directly opposite the plasma source aperture and is shown in FIG. 2. As shown, the side view spectrum is indistinguishable from the front view spectra.

Baseline Atmospheric Helium-Oxygen Plasma Optical Emission Data

Baseline performance of the atmospheric pressure plasma described by Babayan and Hicks (U.S. Pat. No. 8,328,982, Dec. 11, 2012) was collected using an optical emission spectroscopy (OES) set up that was not incorporated into the plasma head. In the experiments described in this specification, the OES data will be used to differentiate the performance increase produced by several features of the plasma apparatus under study. All optical emission spectrums were collected at an integral time of 100 milliseconds (ms) using an Ocean Optics USB2000+ spectrometer, with particular attention paid to the metastable oxygen emission line at 777 nm.

Babayan and Hicks' sources (U.S. Pat. No. 7,329,608, Feb. 12, 2008; and U.S. Pat. No. 8,328,982. Dec. 11, 2012) construct comprises bare metal ground and powered electrodes without any additional features to regulate temperature, gas flow profiles, or downstream plasma temperature. In these plasma sources, the temperature is initially room temperature, ~21 degrees C., and during operation it warms up from room temperature to 150 degrees C., depending on plasma duration and process conditions. Plasma feed gas is fed into a large dead volume prior to breakdown in the active region. The inventors assume that the small cross section of the active zone forces the feed gas into laminar flow and no recirculation exists in the upstream dead volume. Moreover, by using bare metal electrodes, the use or inclusion of argon in the plasma feed gas will lead to significant arcing (i.e. gamma mode) and make stable (i.e. alpha mode) operation impossible.

Figure 3:
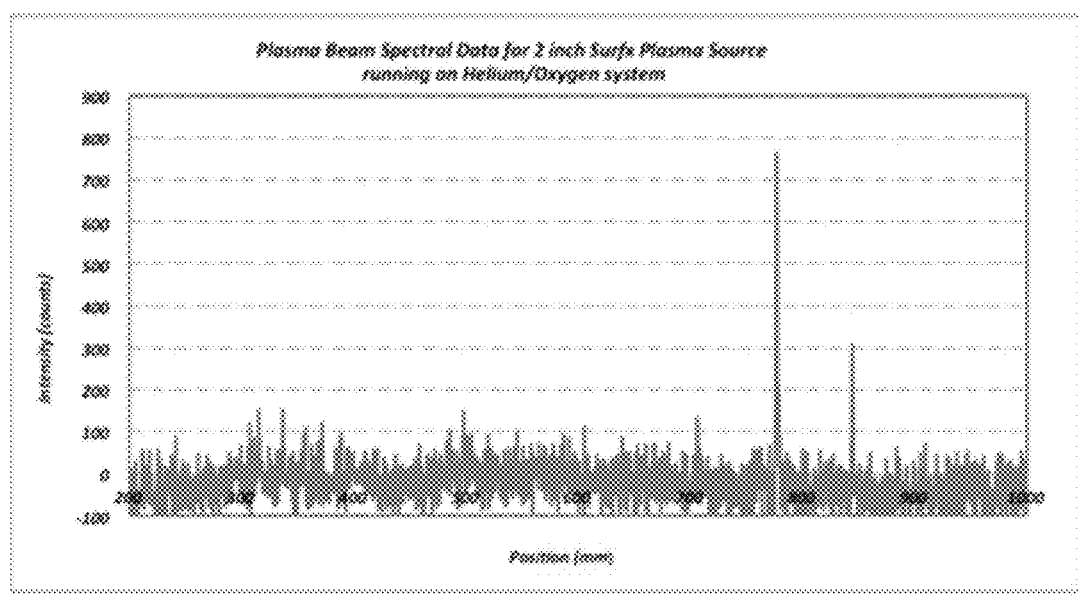
FIG. 3 is a plot of baseline optical emission spectrum for nominal helium-oxygen plasma produced by the device described by Babayan and Hicks.

The baseline OES result of the device constructed by Babayan and Hicks with a 2-inch wide linear aperture length operated at nominal helium plasma process conditions (160 W, 30 LPM He, 0.65 LPM $O_2$) is shown in FIG. 3. The metastable oxygen peak at 777 nm exhibits an intensity of ~760 counts with a low signal-to-noise ratio.

Temperature Controlled Plasma Sources with Non-Metal Electrodes)

The plasma source construct described in this patent application contains substantially different features that not only result in more reliable performance, but in a much higher metastable and active species concentration, as well as the ability to produce stable argon plasmas. One important feature is the use of non-metal electrodes. Note that a number of materials and methods can be used to make or produce the non-metal electrode. Materials can comprise, but are not limited to, polymers, ceramics, insulators, thermoplastics, and composites. Methods to produce the non-metal electrode include, but are not limited to, machining, coating, mechanical fastening, and sintering.

Figure 4:
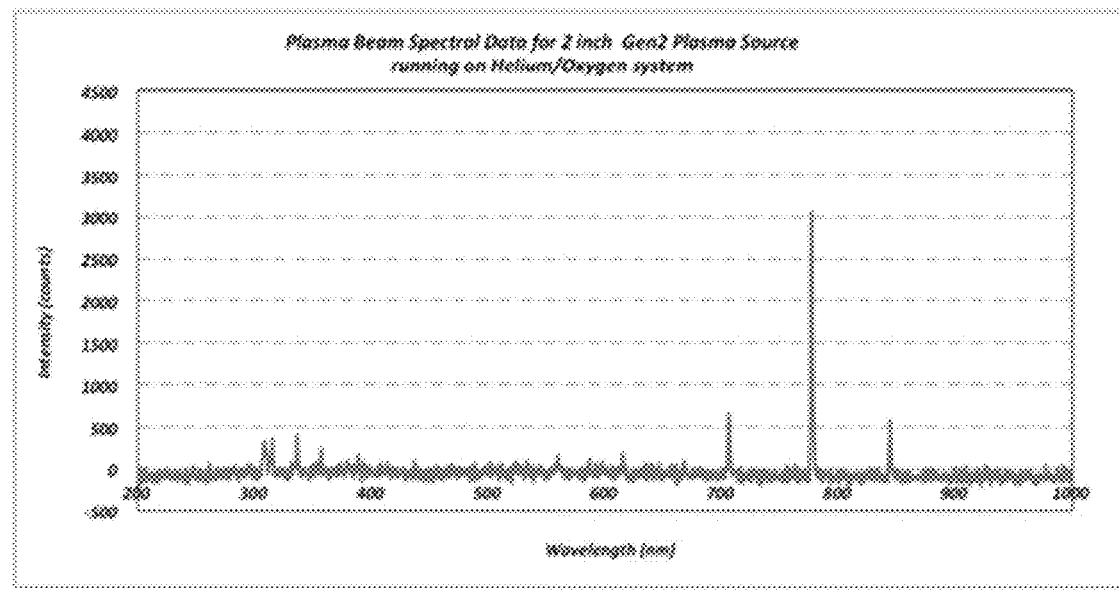
FIG. 4 is a plot of baseline optical emission spectrum for nominal helium-oxygen plasma produced by an embodiment of the device described in this application at a temperature of 60 degrees C.

Another embodiment of the invention is a temperature-controlled plasma source, where the temperature is maintained above room temperature. A heat exchange liquid, including deionized water, is pumped through the plasma source's active electrodes (i.e. ground and power electrodes) at a constant rate. The temperature of the fluid is regulated by a temperature controller that contains both a heating element (in line filament heater, for example) and a cooling element (forced convection cooling fins, for example), so that the temperature of the fluid can be controlled within a few degrees Celsius. Note that since the heat exchange fluid is in contact with the active electrodes, it is critical that the fluid is not a conductor, otherwise the impedance matching of the system will be affected. The fluid exchanges temperature with the plasma source electrodes by both convection and conduction such that the fluid and electrode temperatures are in equilibrium. By regulating temperature, more reproducible and stable plasma generation and sustainment is obtained, as well as an improved electrode lifetime. Show in FIG. 4 is the OES spectrum of the temperature-regulated plasma source also with a 2-inch linear plasma beam operating at the same conditions as FIG. 3. The recirculating water temperature was set at 60 degrees C.

The intensity of the metastable oxygen emission line at 777 nm is markedly larger than the baseline Babayan and Hicks plasma source (3100 vs. 760). Moreover, the signal-to-noise ratio is much larger than this other case. The nearly fourfold increase in metastable intensity (and thus metastable concentration) without any change to the plasma conditions was unexpected and suggests a more stable and efficient helium-oxygen plasma is being produced as a result of the non-metal electrode and temperature regulation at 60 degrees Celsius.

Figure 5:
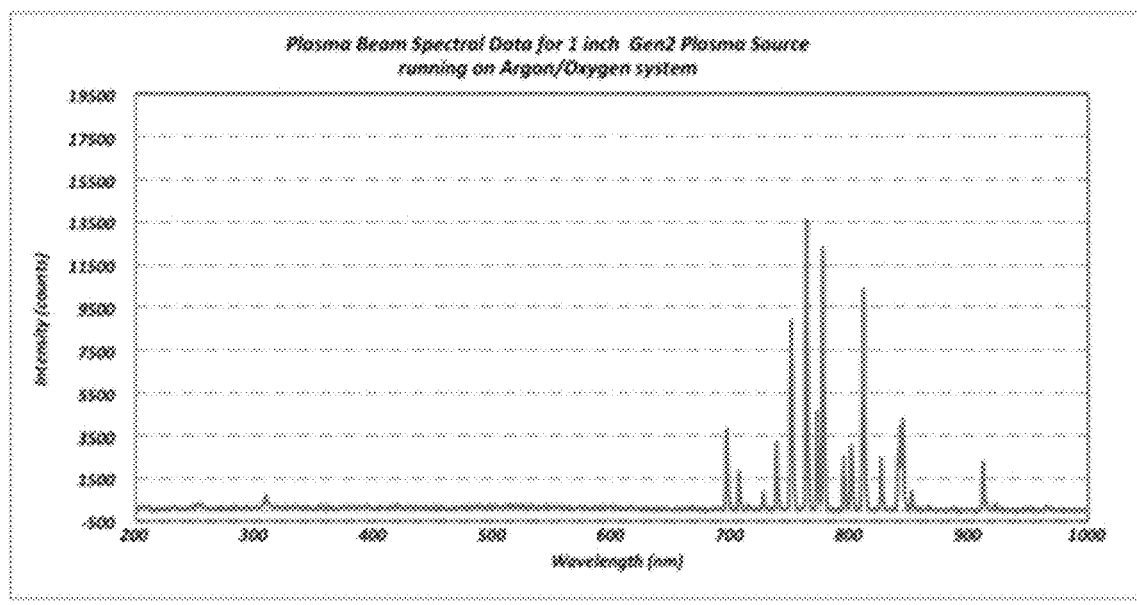
FIG. 5 is a plot of optical emission spectrum for nominal argon-oxygen plasma produced by an I-inch linear embodiment of the device described in this application at a temperature of 60 degrees C.

Additional data was acquired using an embodiment where the length of the plasma afterglow exit beam was reduced from two inches to one inch, while maintaining other plasma conditions the same. The heat exchange fluid (and thus the plasma source) temperature was held constant at 60° C. in order to strike and operate a stable argon plasma. Fluid temperature less than 40° C. resulted in unstable plasma. Temperatures higher than 60° C. could be used, but yielded only a minimal (<5%) increase in the OES emission. Therefore, another aspect of the invention is to maintain the temperature of the fluid recirculating through the plasma source in the range from 40 to 80 degrees Celsius, with an alternative embodiment being a temperature of 60 degrees Celsius. The OES of a 1-inch linear embodiment of the invention operated with argon at 160 W, 17 liters per minute (LPM) argon, and 0.75 LPM $O_2$ is shown in FIG. 5. The intensity of the metastable oxygen emission at 777 nm was 12,300 counts, a fourfold increase compared to using helium on a comparable construct and over 15 times higher than Babayan and Hicks' device performance (refer to FIG. 3).

This large increase in metastable oxygen emission is surprising given helium plasma's higher electron temperature (thus being able to break down a larger fraction of oxygen). However, argon plasma has an electron density about twice that of helium plasma, which may explain some but not all of the increase in the 777 nm emission line. Nonetheless the observed increase in metastable oxygen emission points to a much more reactive plasma when argon is fed to the plasma source compared to helium.

Figure 6:
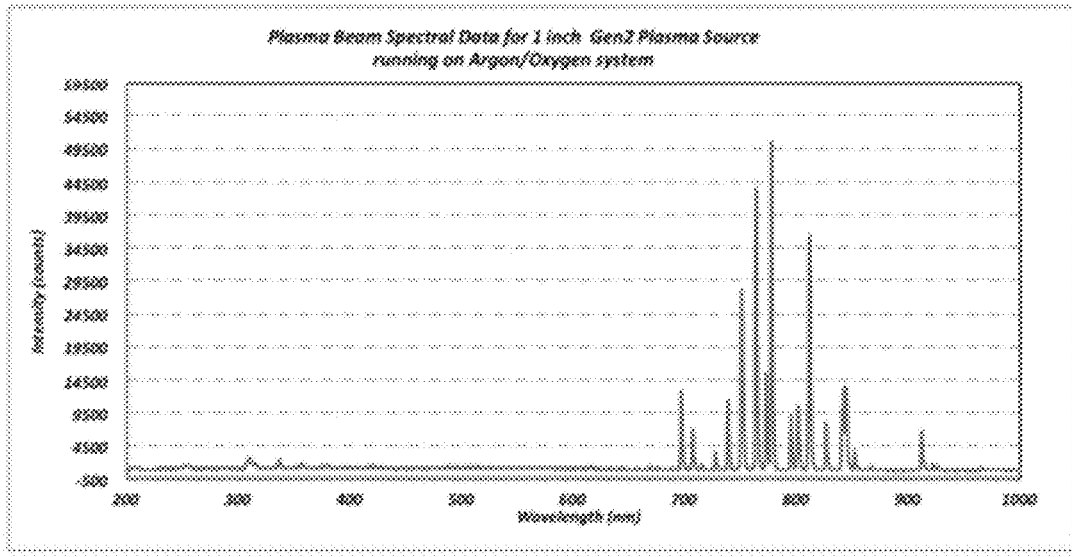
FIG. 6 is a plot of optical emission spectrum for nominal argon-oxygen plasma produced by a 1-inch linear embodiment of the device described in this application at a temperature of 60 degrees C. and a different electrode shell material than the embodiment used for FIG. 5.

Yet additional plasma enhancement can be achieved by optimizing the non-metal electrode's material composition. The electrical properties of the electrode can be altered by changing the material that it is made of entirely, or by coating or mechanically fastening a different material on the outer surface of the main electrode body. The later methods are suitable for non-metal materials with the required electrical characteristics, because they are typically fragile and difficult to machine. When coating or mechanical fastening is employed, the thickness of the coating or shell material has a large effect on the breakdown voltage and dielectric constant, both of which affect the plasma characteristics significantly. Shown in FIG. 6 is the optical emission spectrum for the source used in FIG. 5 with a different electrode outer shell material at identical plasma conditions (160 W, 17 LPM Ar, 0.75 LPM $O_2$).

The metastable oxygen emission at 777 nm for this embodiment was an astounding 50,500 counts, over a fourfold increase from the previous example. This is also over 65 times higher than the baseline emission exhibited by the device described by Babayan and Hicks (refer to FIG. 3).

Figure 7:
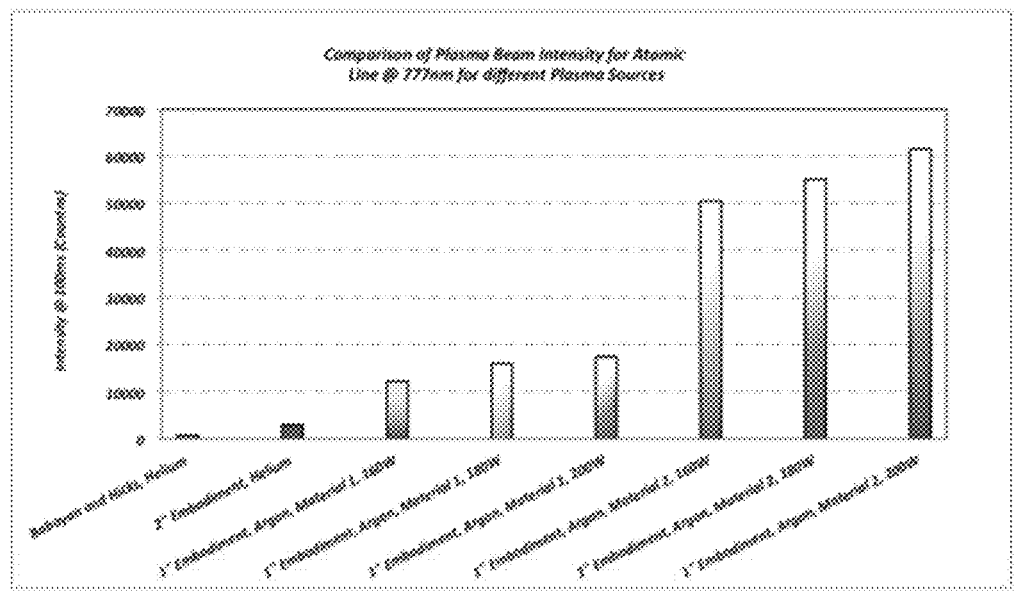
FIG. 7 shows optical emission spectrum for metastable oxygen emission at 777 nm of current embodiments compared to Babayan and Hicks' device.

Shown in FIG. 7 is a summary of the metastable oxygen emission line at 777 nm of the different embodiments of the invention described above. The results obtained for the Babayan and Hicks invention (U.S. Pat. No. 8,328,982, Dec. 11, 2012), which was found to be incapable of generating a stable argon plasma, are shown for comparison. Using the same feed gases, helium and oxygen, and the same process conditions, the embodiment that has temperature-controlled, non-metal electrodes set to 60° C., increases the emission fourfold. Further performance gains are obtained when argon replaces helium as the inert feed gas. Note that changing process parameters (i.e. power and gas flow rates) will also affect emission performance, but the gain obtained through these changes is much less than those obtained through the embodiments of the invention.

Figure 8:
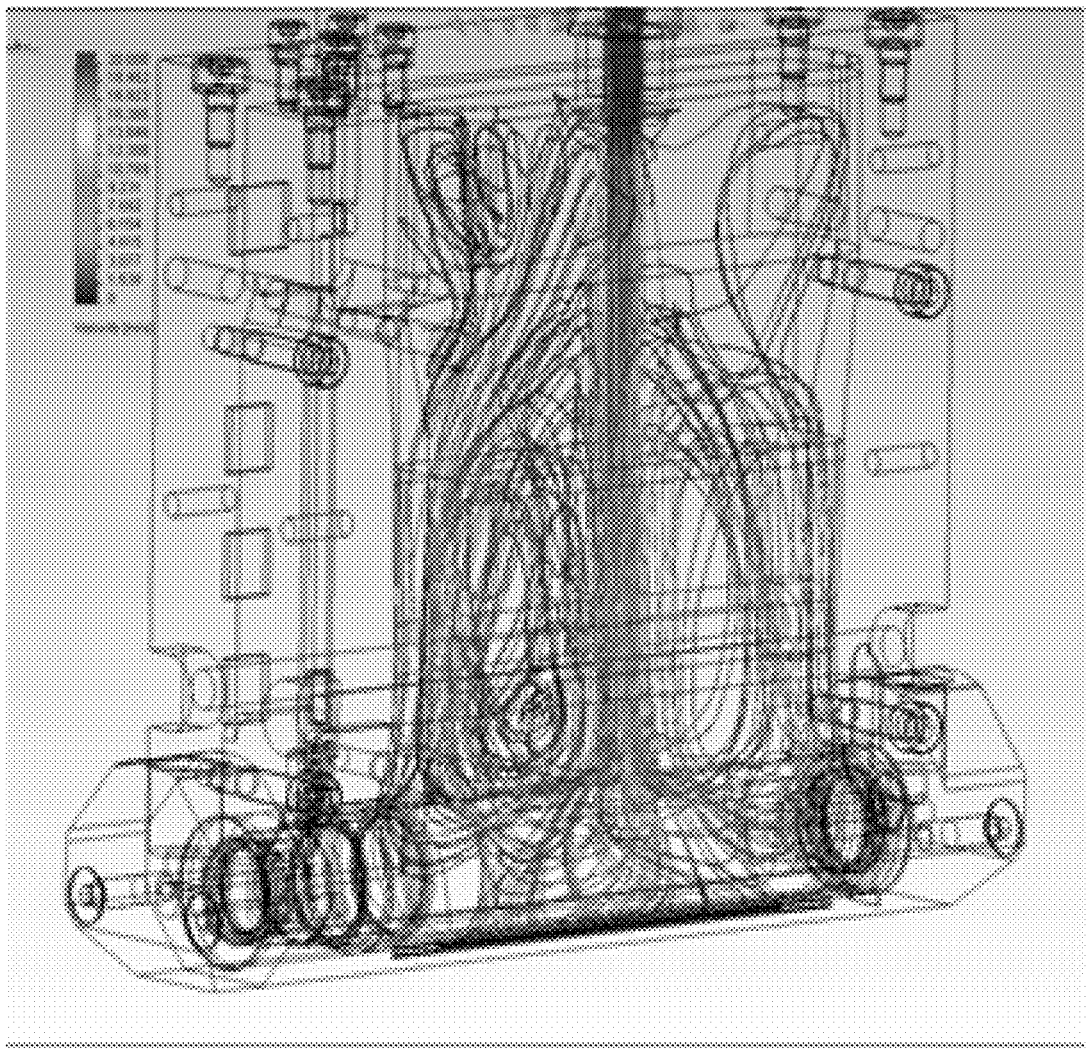
FIG. 8 shows a finite element analysis model of the gas fluid dynamics of an embodiment employing only a fluid choke to regulate gas flow.

Laminar Flow Insert in another embodiment of the invention, a uniform plasma across the entire aperture length is obtained by achieving laminar flow through the plasma housing, free of any dead spots, recirculation, or turbulence. During the evaluation and comparison of Babayan and Hicks' apparatus (U.S. Pat. No. 8,328,982, Dec. 11, 2012), it was found that stable and predictable laminar flow was not achieved. Shown in FIG. 8 is the finite element analysis result of the gas fluid dynamics of an embodiment employing a fluid choke to regulate gas flow, like that described by Babayan and Hicks. In the Figure, the lines represent the gas velocity vector with color representing speed (red is fastest while blue is slowest). As shown, the gas velocity is highest at the inlet and varies widely across the volume. Dead space, where an absence of gas exists, is present in the upper right-hand corner of the volume. Gas recirculation is rampant, with the gas velocity across the electrode highly non-uniform and actually parallel to the axial direction in some places instead of perpendicular as desired.

Figure 9:
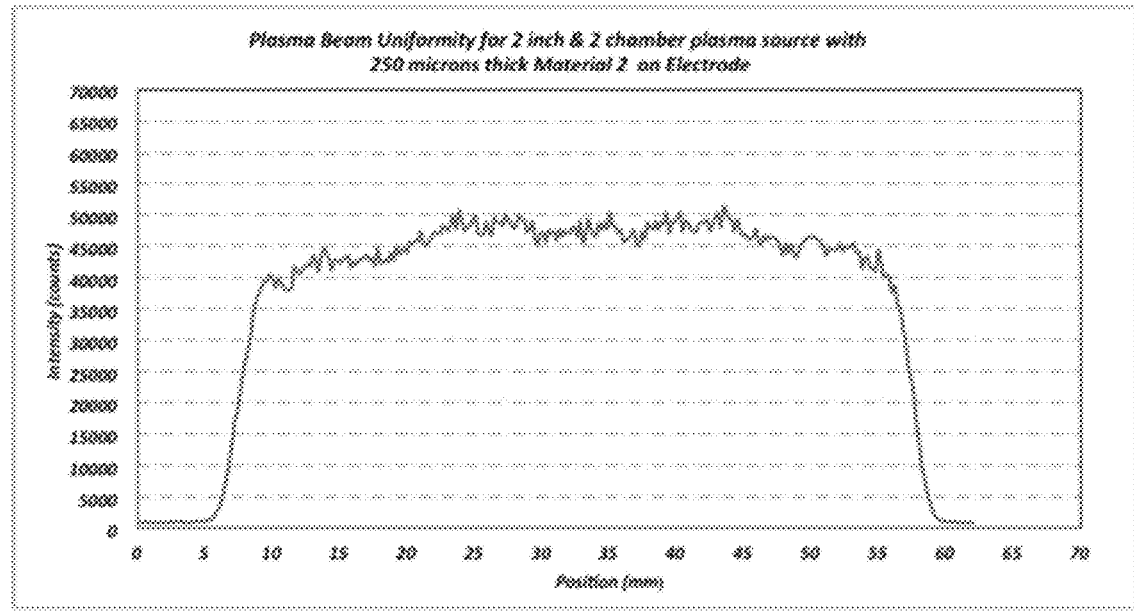
FIG. 9 is a plot of metastable nitrogen emission line at 336 nm collected along 50 mm aperture length for baseline case using only gas choke to regulate gas fluid dynamics.

This non-uniform gas flow pattern leads to a highly non-uniform plasma emission (and thus will result in non-uniform treatment or deposition). Shown in FIG. 9 is the metastable nitrogen emission at 336 nm taken across the ~50 mm aperture length for argon-nitrogen plasma. For analysis purposes, only the region between 10 mm and 50 mm is examined as the regions outside these bounds are subject to edge effects. Uniformity is characterized in two ways: the first is R/2, or half range (i.e. maximum minus minimum divided by two), and the second is 1-σ (i.e. standard deviation divided by average). For this baseline case with the gas choke, the R/2 and 1-σ figures of merit are 17.5% and 6.0%, respectively. It is clear by the visual inspection of the graph this profile is not uniform. Numerically, linear uniformity is generally considered "good" for R/2 values <4%, and 1-σ of <1.5%.

Figure 10:
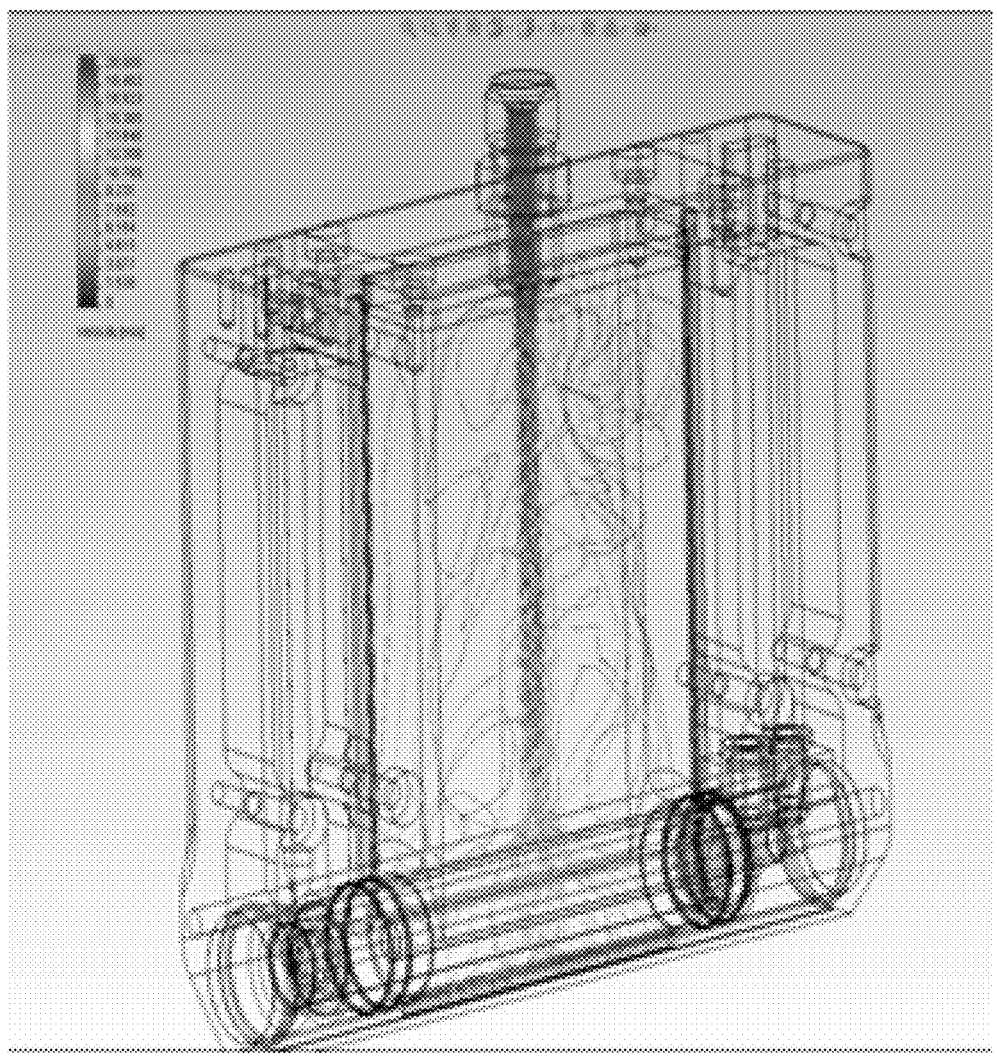
FIG. 10 shows a finite element analysis model of the gas fluid dynamics of an embodiment with a decreased dead volume and longer gas travel path.

The gas velocity, and in turn the plasma uniformity, can be improved moderately by decreasing the dead space volume and elongating the gas travel length. The finite element analysis of the fluid dynamics of such a construct is shown in FIG. 10. Making these two changes still results in large velocity variations within the volume, but there is substantially less recirculation and little lengthwise travel of plasma gas along the electrode.

Figure 11:
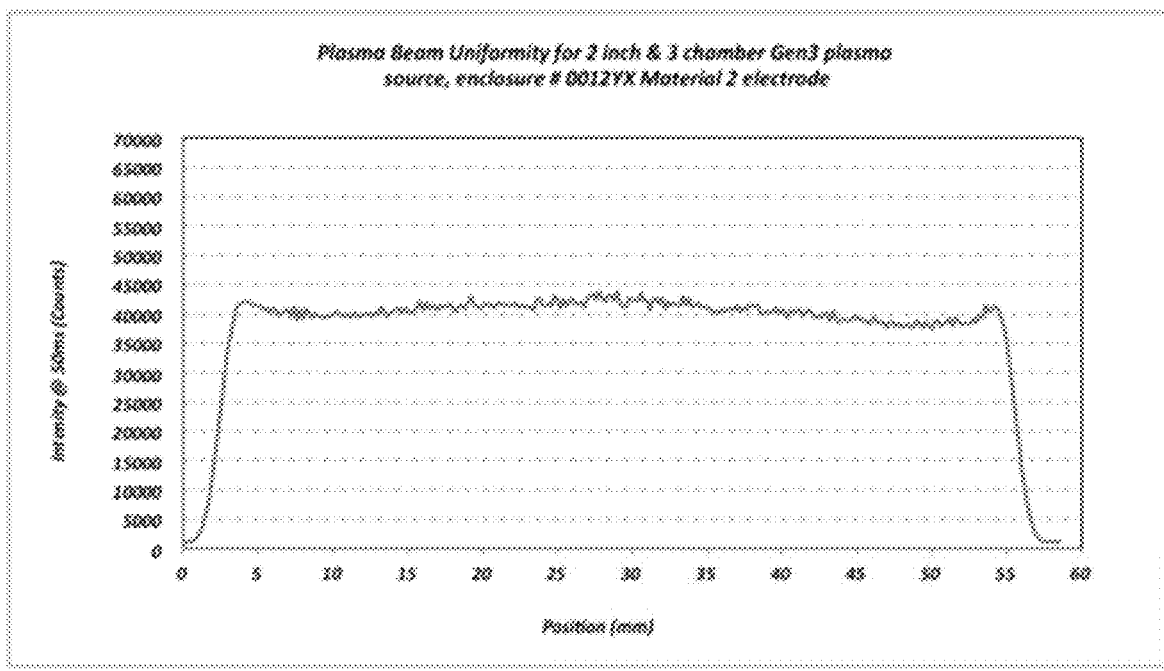
FIG. 11 is a plot of metastable nitrogen emission line at 336 nm collected along 50 mm aperture length for reduced dead space and elongated gas flow path embodiment.

The effect of reducing dead space and elongating gas flow path on plasma uniformity was collected and is shown in FIG. 11. Looking again at the portion from 10 to 50 mm, the R/2 and 1-s uniformity was calculated to be 8.5% and 3.4%, respectively. This unexpected improvement in the plasma uniformity across the two-inch aperture length came in spite of the large velocity variations still observed. However, local fluctuations at the center region where gas flow differences are most evident are still present.

Figure 12:
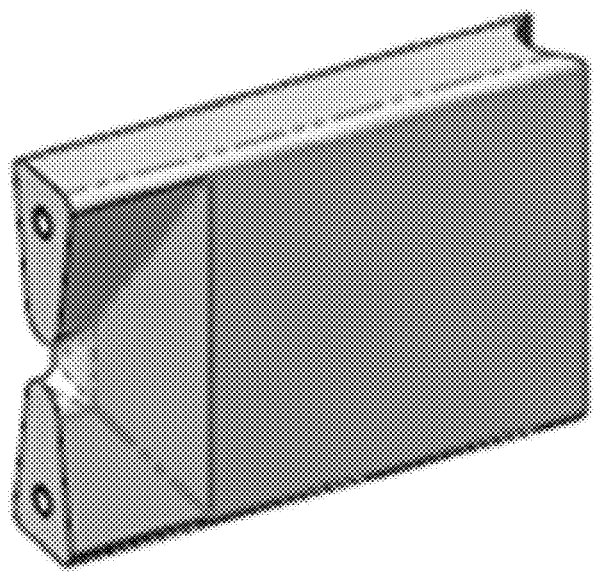
FIG. 12 shows an exemplary laminar flow insert used in an embodiment of the invention to improve plasma source uniformity.
Figure 13:
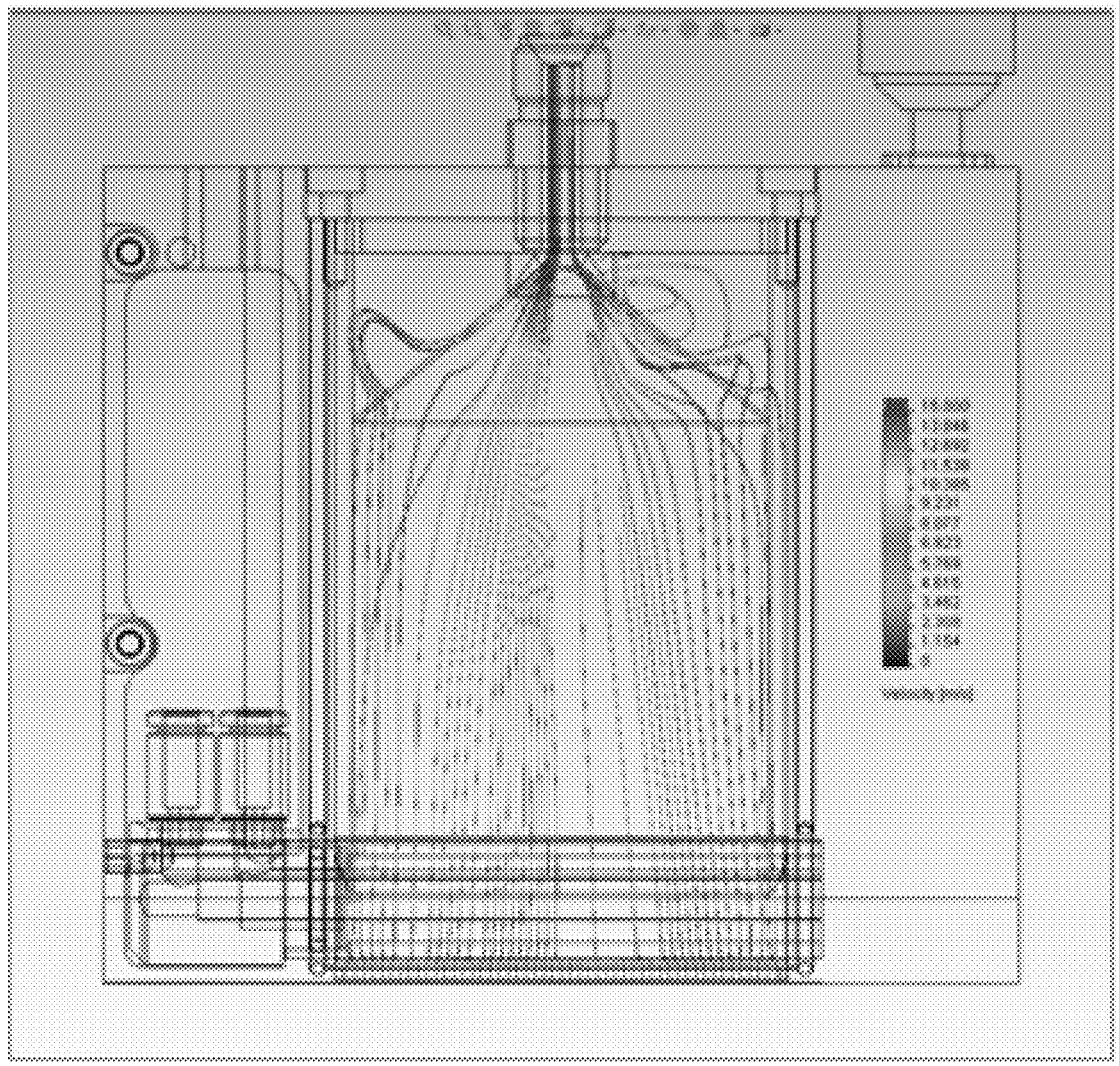
FIG. 13 shows a finite element analysis model of the gas fluid dynamics of an embodiment with the laminar flow insert illustrated in FIG. 10.

In another embodiment of the invention, a laminar flow insert was constructed to force the gas flow into a laminar flow pattern. A schematic of this flow insert is shown in FIG. 12, and the calculated gas flow pattern is shown in FIG. 13.

Figure 14:
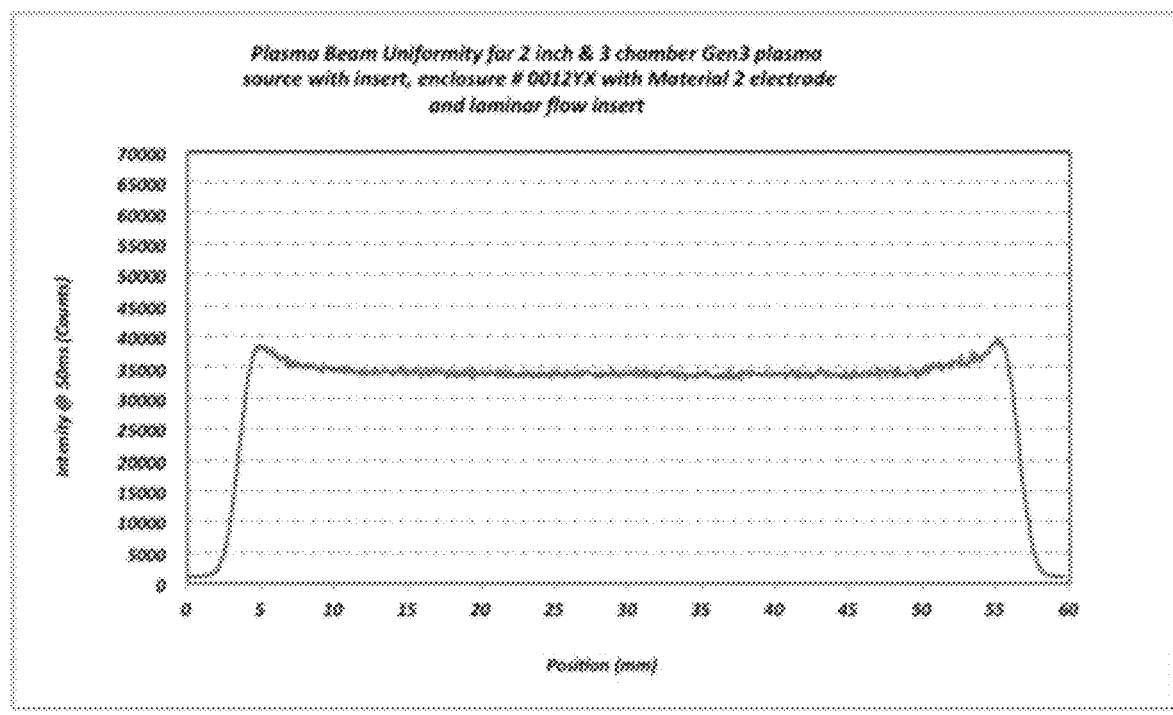
FIG. 14 is a plot of metastable nitrogen emission line at 336 nm collected along 50 mm aperture length embodiment with laminar flow insert.

The laminar flow insert, when placed into the gas volume, results in two flat and parallel gas flow paths on opposite sides of the volume through which the plasma feed gas must travel. These flat paths force the gas into uniform, and predictable laminar flow. When the gas arrives at the active electrode, it is flowing perpendicular to the electrode and at the same velocity at all points along the electrode. This is shown in FIG. 13. This uniform laminar flow results in a much more uniform plasma along the length of the linear aperture, as shown in FIG. 14.

With use of the laminar flow insert, the R/2 and 1-s non-uniformity was calculated to be 3.0 and 1.0%, respectively, when examining the region between 10 to 50 mm. This is a sixfold improvement in plasma uniformity over the prior art. Further uniformity improvement at the regions outside of 10 to 50 mm can be obtained if the gas flow width is reduced or if additional tweaks to the laminar flow insert are made.

Auto-Tuning Matching Network

Another embodiment of the invention is the automatic tuning network developed in order to implement argon plasma. For radio frequency plasmas, the impedance of the electrical system (i.e. the combination of RF generator, plasma source, plasma feed gas, etc.) is matched to 50 Ohms. In order to do this, most RF plasma systems employ a matching network that accommodates the changing impedance brought on by initiating a plasma and/or by changing the gas composition or power of the plasma. This can be done in three ways: 1) a fixed match where the incoming plasma gas is of constant composition and plasma power is also fixed, 2) a one-variable tuning capacitor configuration which can account for small changes in process conditions, and 3) a two-variable tuning capacitors configuration which can account for large changes in process and plasma source conditions. The matching network is broken into a "load" portion, which accounts for hardware, and a "tune" portion, which accounts for process conditions.

Most implementations of RF plasmas choose the second route as the first is too limited, and the third presents significant tuning algorithm challenges. For the second, single variable capacitor, configuration it is often done such that the "load" portion of the matching network is fixed. The "tune" or process-based portion is left to be tuned with a variable capacitor with a range of a few hundred pF capacitance. This method is attractive for generating and sustaining helium discharges, as the helium plasma's impedance at the strike condition is nearly identical to its impedance at steady state operation. However, the single-variable-capacitor configuration is not suitable for argon plasma generation. Argon discharges having significantly different impedances during striking and at steady-state operation. In fact, with the same apparatus, for argon plasmas the required "load" portion of the impedance is markedly different during plasma start up and sustained operation. Thus, the matching network must be able to accommodate the required load impedance change. Some implementations have used a RF relay to change the load portion after argon plasma initiation, but this method often results in failed or burnt relays as RF power spikes significantly after striking.

Another embodiment of the invention is the use of two variable capacitors and an automatic tuning algorithm that is fast and robust, yielding the proper impedance match without having the plasma extinguish during strike and operation. This is a non-trivial task as over-tuning in either the load or tune variable capacitors will lead to rapid plasma collapse, which leads to either extinguishment or arcing. Moreover, a perfectly tuned argon plasma is prone to sudden collapse and extinguishment. It is clear that the tuning algorithm is another embodiment of the invention that produces stable and uniform argon discharges.

In an embodiment of the invention, a fast and robust tuning algorithm was developed that makes use of the forward and reflected RF power as an inline monitor of the impedance matching. As the system impedance gets closer to the 50-Ohm match, the forward power increases toward the set point power and the reflected power decreases towards zero. The variable capacitors used in these embodiments are commercially available air capacitors with a central axis of rotation containing metal fins that rotate among a fixed set of metal fins. As the overlap between the rotating and fixed fins changes, the capacitance changes. The capacitor has ~180 degrees of effective freedom (i.e. fins completely aligned to fins completely not intersecting). Note that variable vacuum capacitors can be used in place of the variable air capacitors with no drop off in performance.

At the argon plasma strike tuning network impedance ($I_S$), the load and tune variable capacitors are at $L_S$ and $T_S$ positions, respectively. This results in forward and reflected powers of $F_S$ and $R_S$, respectively. At steady state, stable and uniform plasma is achieved with forward power equal to the set point power ($F=F_{SP}$) and the reflected power minimized to a non-zero value typically tied to a percentage of the set point power (i.e. for example $R=0.01*F_{SP}$). Note that for practical implementations, the forward power is considered to be equal to the desired set point if it is within a few percent of the actual set point (i.e. for 2% acceptance window, $F \sim F_{SP}$ if $0.98 F_{SP} < F < 1.02\ F_{SP}$).

As the RF power is delivered from the generator through the matching network to the plasma source, the plasma ignites and the forward and reflected power instantaneously changes to new values $F_0$ and $R_0$. The impedance of the system with the plasma present also changes to $I_0$, however the capacitor positions remain the same (i.e. $L_S=L_0$, and $T_S=T_0$). At this point, and all points thereafter until the set point values $F_{SP}$ and $R_{SP}$ are reached, the instantaneous $F_n$ and $R_n$ are analyzed and evaluated by the algorithm according to Table 1 in order to adjust $L_{n+1}$ and $T_{n+1}$. The step size, X, shown in the table can be a fixed value including 0.1 or 1.0 degrees at all values of F and R, or it can be set to vary and depend on the difference between the instantaneous and set point forward and reflected powers (for example, $X=0.2*[F_{SP}-F_n]$ or similar). The frequency of evaluation can be set by software and is typically 1-100 hertz.

TABLE 1

Logic algorithm for argon plasma tuning using two variable capacitors tuning network
Forward Power Threshold: ±2.0% $F_{SP}$
Reflected Power Threshold: 1<$R_{SP}$<2% $F_{SP}$

| State | | Tuning Logic | |
|---|---|---|---|
| Forward Power (F) | Reflected Power (R) | Load (L) | Time (T) |
| $F_u > F_{SP}$ | $R_n > R_{SP}$ | $L_{n+1} = L_n$ | $T_{n+1} = T_n - X$ |
| $F_n > F_{SP}$ | $R_u < R_{SP}$ | $L_{u+1} = L_u + 5X$ | $T_{n+1} = T_n$ |
| $F_u < F_{SP}$ | $R_n > R_{SP}$ | $L_{n+1} = L_n - 5X$ | $T_{u+1} = T_u$ |
| $F_n < F_{SP}$ | $R_u < R_{SP}$ | $L_{u+1} = L_u$ | $T_{u+1} = T_u + X$ |
| $F_u > F_{SP}$ | $R_n \sim R_{SP}$ | $L_{n+1} = L_n + 12X$ | $T_{n+1} = T_n - X$ |
| $F_n \sim F_{SP}$ | $R_u > R_{SP}$ | $L_{u+1} = L_u - 5X$ | $T_{u+1} = T_u - 5X$ |
| $F_u < F_{SP}$ | $R_n \sim R_{SP}$ | $L_{n+1} = L_n - 12X$ | $T_{n+1} = T_n + X$ |
| $F_n \sim F_{SP}$ | $R_u < R_{SP}$ | $L_{u+1} = L_u + 5X$ | $T_{n+1} = T_n + 5X$ |
| $F_u \sim F_{SP}$ | $R_n \sim R_{SP}$ | $L_{n+1} = L_n$ | $T_{u+1} = T_u$ |

Once the forward and reflected power set points are reached, the load and tuning variable capacitors cease adjusting and the plasma is considered to be at steady state. Because F and R are continually monitored, if they fall outside the bounds of being considered at the set points, the algorithm readjusts the variable capacitors accordingly to bring the tuning network and plasma back into steady state.

Methods of Processing Materials with Atmospheric Pressure Argon Plasma

The invention is further embodied by methods of processing materials with the atmospheric pressure argon or helium plasma. The reactive gas exits the argon plasma apparatus and impinges on a substrate where cleaning, activation, etching, sterilization and deposition take place. Embodiments of the invention can be practiced with a mixture of argon or helium and other molecular gases at concentrations up to 10.0 volume %. Depending on the desired application, the molecular gas may be oxygen, nitrogen, hydrogen, methane, carbon tetrafluoride, octafluorobutane ($C_4F_8$), nitrogen trifluoride, sulfur hexafluoride, ammonia, water, hydrocarbons with carbon-carbon chain lengths from 2 to 6, and other molecules that would be obvious to those skilled in the art. The temperature of the gas exiting the plasma source generally ranges from 40 to 80° C., although temperatures higher than 80° C. may be used, depending on the particular embodiment of the invention. The temperature of the substrate is important for the desired process, and this can be independently adjusted by the temperature of the fluid that recirculates through the plasma housing.

Examples are given below of methods of processing materials. These examples are not intended to limit the embodiments of the invention, but to illustrate methods in which they can be practiced. The plasma apparatus may be used for many other purposes, which will be understood by those skilled in the art.

Example 1

Method of Cleaning Substrates

The atmospheric pressure argon plasma may be used to remove organic compounds from surfaces, thereby cleaning the substrate. The method of cleaning surfaces is accomplished by flowing argon gas containing reactive molecules through the plasma to convert the molecules into atoms and other reactive species. This gas flow is directed onto the surface to be cleaned. The contaminated surface is exposed to the reactive species generated in the argon plasma for a sufficient period of time to cause organic contamination to be removed without damage to it. A sufficient period of time can be an exposure to the reactive gas for 0.1 second to 1.0 hour, and generally in the range of 1.0 second to 1.0 minute. Since the atmospheric plasma may be scanned over the surface, the total treatment time may be longer than the aforementioned time periods for especially large substrates. Moreover, it may be advantageous for the contaminated surface to be scanned with the argon plasma device multiple times.

Gas molecules that are suitable for embodiments of the invention include but are not limited to oxygen, carbon dioxide, carbon monoxide, nitrogen, nitrous oxide, ammonia and water. These molecules may be converted into atoms, ions or metastable molecules that are effective for surface cleaning. Oxygen containing gas molecules, such as $O_2$, $CO_2$, and $NO_2$, are particularly well suited for embodiments of the invention, because they may be converted into ground-state O atoms, which among other beneficial properties, are effective at etching away organic contamination, but do not react with inorganic surfaces. Atmospheric pressure plasmas suitable for embodiments of the invention include those that generate a substantially high concentration of ground-state atoms, radicals, or metastable molecules downstream of the plasma generation zone, since the treatment method comprises exposing the surface to said reactive species.

To demonstrate this process, an example embodiment of the invention was tested on a laser ablated carbon fiber composite. Organic soot generated from the ablation process contaminates the surface after patterning. The fouled surface was exposed to a mixture of argon and oxygen plasma using the system described. The argon flow rate in the one inch linear beam source was 15.0 liters per minute (LPM), the oxygen flow rate was 0.5 LPM, the power was 150 W, the sample distance was kept constant at 3 mm, and the plasma exposure time was 15 minutes.

Figure 15:
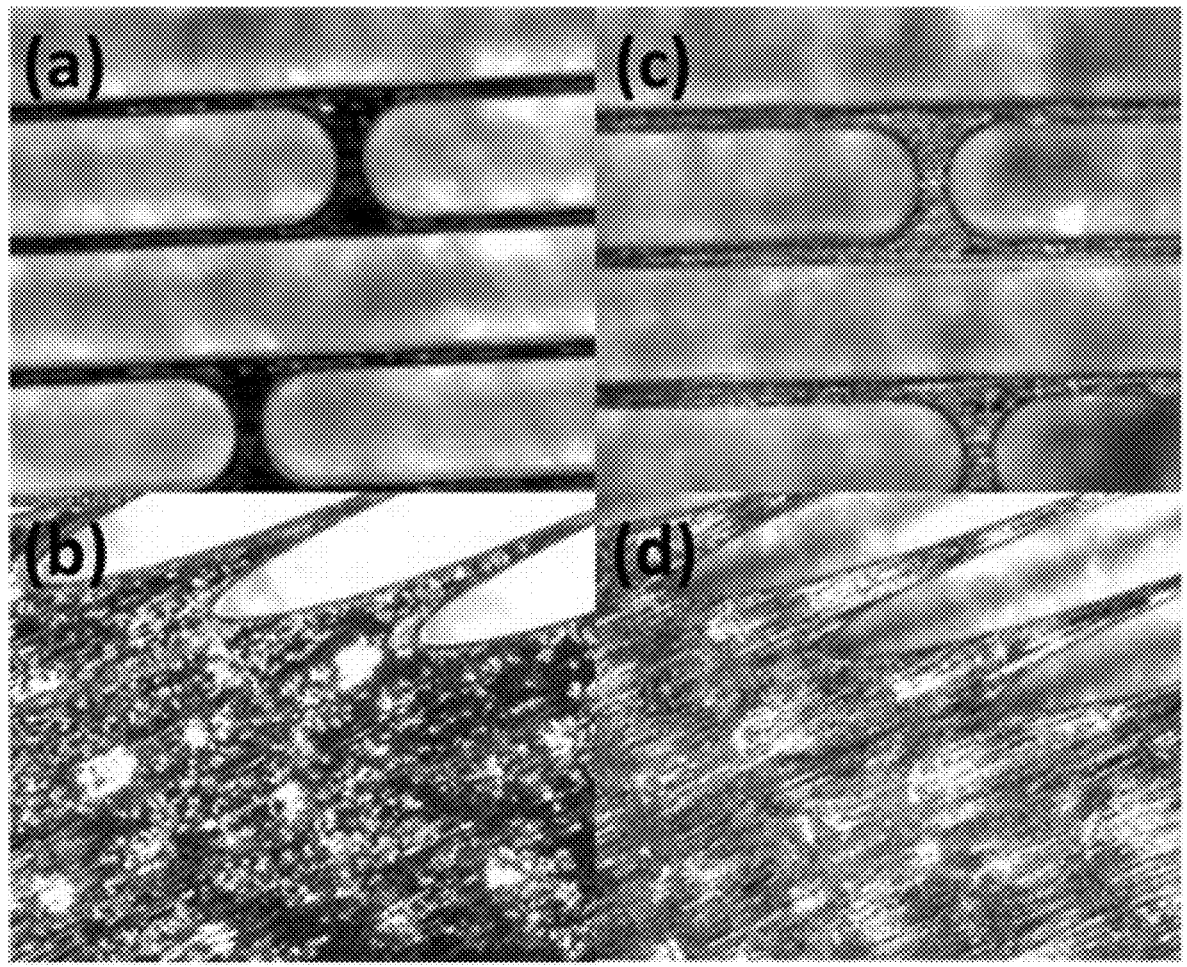
FIG. 15 shows optical images at 250× magnification of contaminated carbon fiber composite before (panels (a) and (b)) and after (panels (c) and (d)) argon/oxygen plasma cleaning.

FIG. 15 shows before and after plasma treatment pictures taken at a magnification of 250 times to determine effectiveness of cleaning. Before plasma exposure, a visual inspection of the contaminated substrate FIG. 15 (a,b) reveals noticeable dark contamination in the areas removed by the laser. FIG. 15 (c, d) shows the removal of the contamination from the patterned area of the substrate with no visible damage to the surface even after 15 minutes of exposure. Profilometer measurements showed no significant change in the surface features after plasma treatment.

This example is only intended to illustrate one application which may be practiced. The argon plasma apparatus may be used to clean many other contaminants and a variety of substrates including polymer films, semiconductor packages, medical devices or other applications which will be understood by those skilled in the art.

Example 2

Method of Surface Activation for Adhesion

Another example of how one may practice an embodiment of the invention is to modify the surface of plastic or other materials. For example, the argon plasma apparatus can be used to enhance the wettability of a surface. To demonstrate this, a number of materials were treated and the wetting behavior quantified before and after processing by water contact angle (WCA) measurements. A hydrophobic material can be made hydrophilic by treating it with the atmospheric pressure argon and oxygen plasma. A high water contact angle (>80° C.) results in a surface that will repel aqueous coatings and adhesives. A water contact angle of less than 45° means that the surface is hydrophilic. A hydrophilic surface accepts adhesives, paints, inks and coatings, which will come into intimate contact with the surface and adhere to it. These substrates will adhere much more strongly and robustly than an untreated hydrophobic surface allowing for greater reliability of bonded or coated parts.

In one aspect an example embodiment of the invention allows one to treat substrates at a significantly faster rate so as to allow for high throughput production. In another aspect an embodiment of the invention allows one to treat materials which are thermally sensitive and cannot ordinarily be plasma treated without significant damage to the substrate. Mixtures of argon and oxygen and helium and oxygen were scanned over many materials at different speeds in order to show the ability to activate surfaces at an exceptionally rapid processing speed.

Embodiments of the invention described here has been used to activate silicon, alumina ceramic, carbon-fiber reinforced epoxy composite, polyimide, polyurethane, polyethylene, aluminum, titanium and many other substrates. A comparison between embodiments of the invention and the prior art of Babayan and Hicks (U.S. Pat. No. 8,328,982, Dec. 11, 2012) is presented to illustrate the unexpectedly rapid processing speed of embodiments of the invention, particularly when treating substrates which are thermally sensitive.

The substrates treated with the argon plasma apparatus were processed under the same RF power, oxygen flow rates, source-to-sample distance, and scan speeds as the prior art of Babayan and Hicks (U.S. Pat. No. 8,328,982, Dec. 11, 2012). In this way, the unexpected results of embodiments of the invention can be revealed. All of the "$He/O_2$" data presented herein was gathered using the device described by Hicks and Babayan, while the "$Ar/O_2$" data was collected using embodiments of the invention. The substrates were treated at 100 W, 15.0 LPM primary gas (argon or helium), 0.25 LPM $O_2$ flow rate, 4 mm distance from source to substrate, and a varying plasma scan speed of 10 to 400 mm/s over the material surface. Before and after plasma treatment, the surface energy of each material was measured with a Krüss goniometer.

Figure 16:
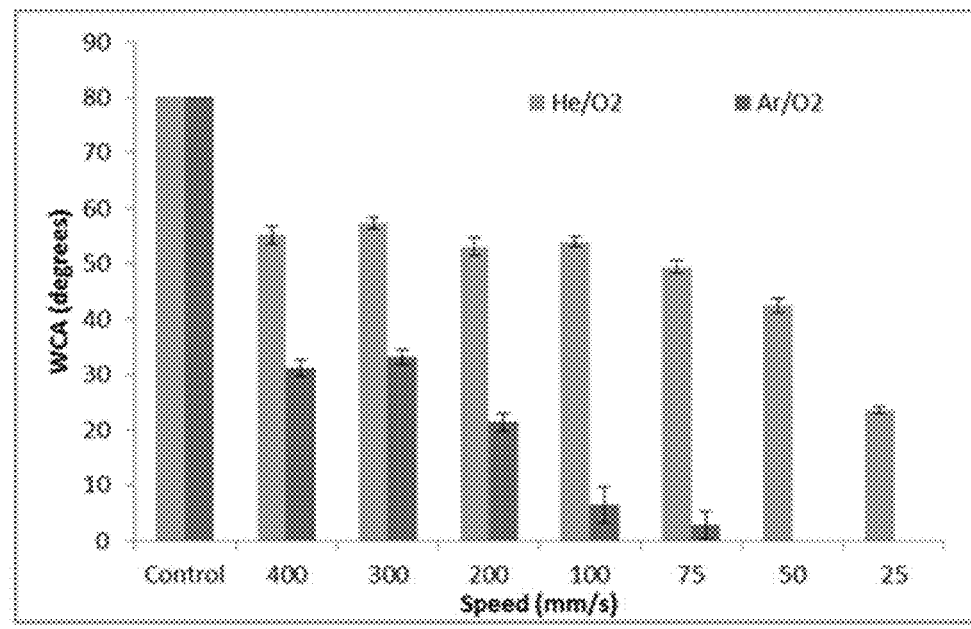
FIG. 16 is a bar graph of silicon activation rate following plasma activation measured by water contact angle as a function of plasma scan speed of the substrate surface using a $He/O_2$ and $Ar/O_2$ plasma.
Figure 17:
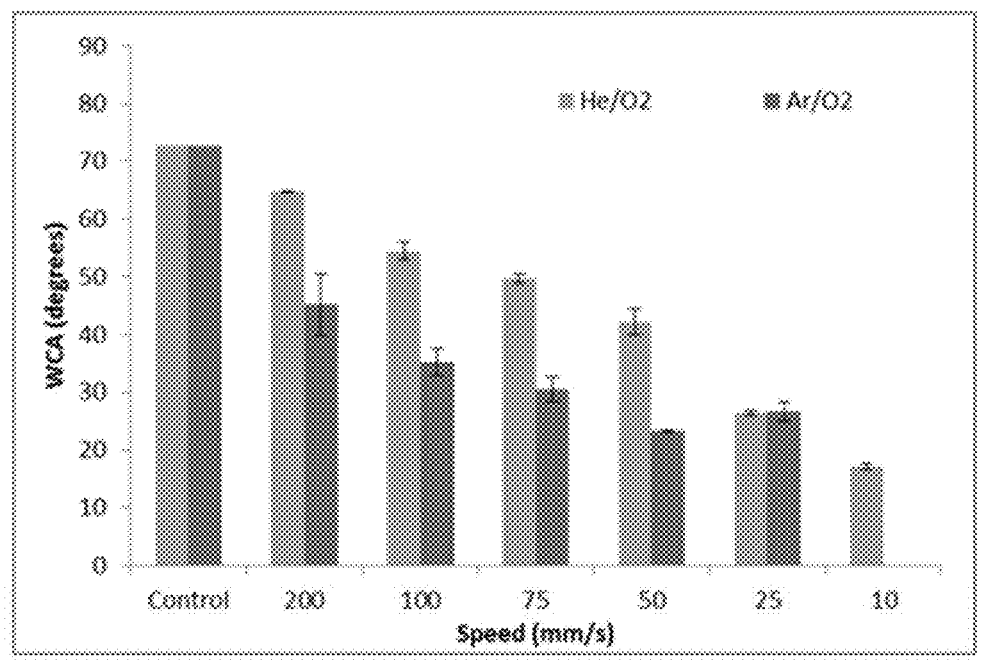
FIG. 17 is a bar graph of water contact angle of polyimide (Kapton) as a function of plasma scan speed using a $He/O_2$ and $Ar/O_2$ plasma.
Figure 18:
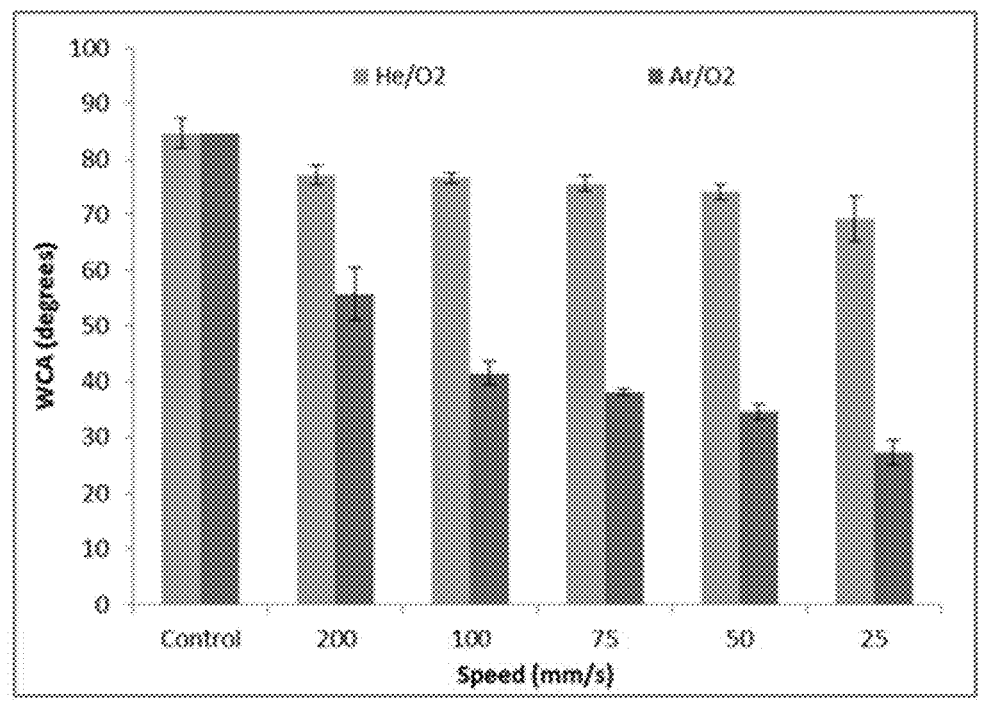
FIG. 18 is a bar graph of water contact angle of carbon-fiber reinforced epoxy as a function of plasma scan speed using a $He/O_2$ and $Ar/O_2$ plasma.
Figure 19:
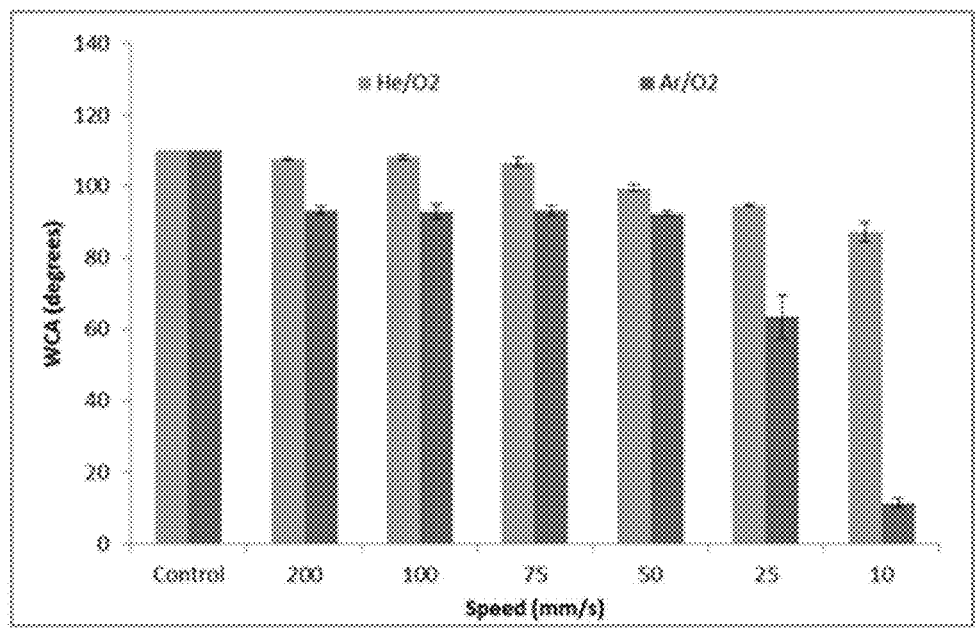
FIG. 19 is a bar graph of water contact angle of polyurethane as a function of plasma scan speed using a $He/O_2$ and $Ar/O_2$ plasma.
Figure 20:
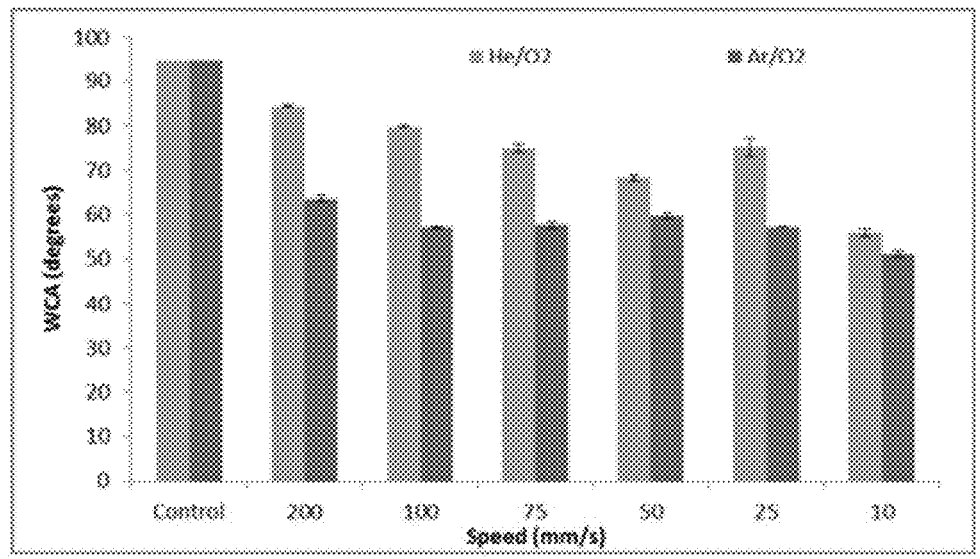
FIG. 20 is a bar graph of water contact angle of high density polyethylene as a function of plasma scan speed using a $He/O_2$ and $Ar/O_2$ plasma.

Shown in FIG. 16 is the water contact angle of a silicon wafer as a function of the processing speed using the prior art, He/O₂ plasma, and an example embodiment of the invention, Ar/O₂ plasma. It was found that the water contact angle of the silicon surface was reduced to a completely hydrophilic surface (0° water contact angle) using a much faster scan speed with an embodiment of the invention as compared to the prior art. A water contact angle of 0° is achieved after a 50 mm/s processing speed with an embodiment of the invention, Ar/O₂ plasma, while the silicon treated with the prior art, He/O₂ plasma, had a contact angle of over 400 at this speed. Even if the scan speed is further reduced to 25 mm/s, the prior art, He/O₂ plasma, does not fully wet and exhibits a wetting angle of >20°.

Similar results are observed for the activation of polymeric materials. The plasma activation rate of polyimide (Kapton), epoxy composite, polyurethane and polyethylene are shown in FIGS. 17-20. The water contact angle after a 10 mm/s scan using plasma changed as follows: polyimide was reduced from 70° to 0° with an embodiment (Ar/O₂) and 15° with the prior art (He/O), epoxy decreased from 85° to 15° with an embodiment (Ar/O₂) and 70° with the prior art (He/O₂). At a scan speed of 25 mm/s, polyurethane decreased from 1100 to 10° with an embodiment (Ar/C₂) and from 110° to only 85° with the prior art (He/O₂), Also, at this scan speed, polyethylene decreased from 95° to 50° with an embodiment (Ar/O₂) and from 95 to 550 with the prior art (He/O₂).

Figure 21:
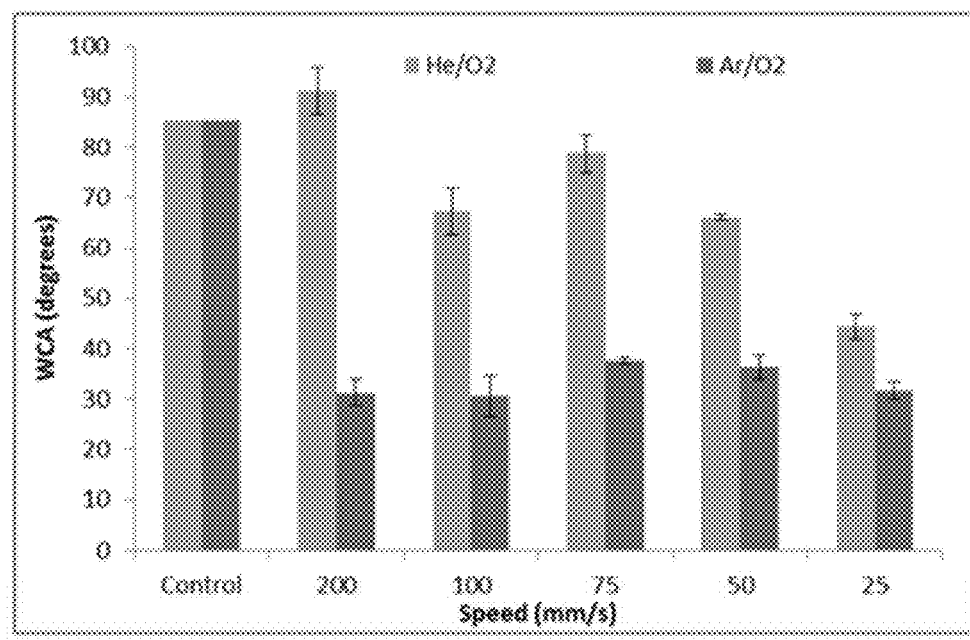
FIG. 21 is a bar graph of water contact angle of titanium as a function of plasma scan speed using a $He/O_2$ and $Ar/O_2$ plasma.
Figure 22:
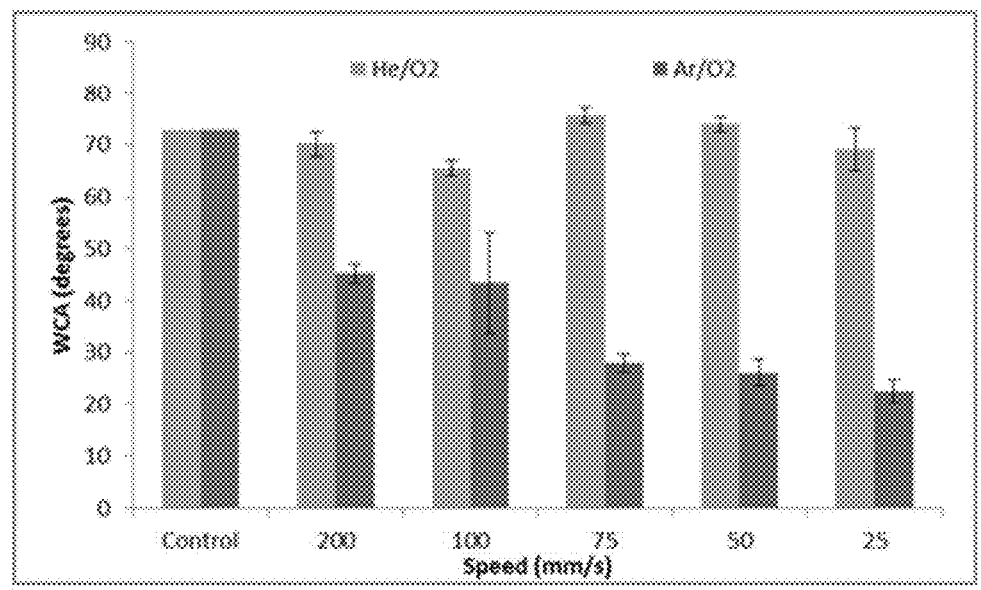
FIG. 22 is a bar graph of water contact angle of aluminum as a function of plasma scan speed using a $He/O_2$ and $Ar/O_2$ plasma.

Another aspect of the invention is a method of activating the surfaces of metal substrates, including titanium and aluminum. The process conditions used in this example are identical to those used on the silicon and polymer substrates described in the preceding section. A marked improvement in performance is observed when using an embodiment of the invention. For example, the wetting angle of titanium is reduced from 85° to 30° at a speed of 200 mm/s using the argon plasma apparatus. In contrast to the prior art, He/O₂ plasma, which achieves a WCA of only 45° with a much slower process speed of 25 mm/s. An even more dramatic difference in plasma performance is observed with the aluminum substrate. The water droplet test was 75° before treatment and remained virtually unchanged after 25 mms with the prior art, He/O₂ plasma. In contrast, a decrease from 75° to 25° water contact angle is achieved with an embodiment of the invention, Ar/O₂ plasma, using the 25 mm/s scan speed. The results of these experiments are presented in FIGS. 21 and 22 for titanium and aluminum, respectively.

To demonstrate the maximum surface temperature experienced by a material being treated with an embodiment of the invention, an aluminum membrane tin plate was processed and the resulting temperature was recorded with a thermocouple. The conditions used in this test were 150 W RF power, 15 LPM of primary gas flow rate (argon or helium) 0.5 LPM O₂ flow rate. The offset distance from the plasma source to the substrate and the scan speed of the plasma source were varied as indicated in Table 2 along with the temperature of the substrate listed in degrees Celsius. The method using the argon plasma is significantly cooler than the prior art method using the helium plasma. At a 3 mm offset with a 2 mm/s scan speed, the water-cooled argon plasma is ~20° C. cooler than the helium plasma. This difference is much more pronounced at the greater offset distance of 7 mm with the 2 mm/s scan speed. Under these conditions, the water-cooled argon source was 35° cooler than the helium plasma, even with water cooling applied to the latter apparatus. These results highlight another aspect of the invention, namely the reduced heating of the substrate during processing.

TABLE 2

Maximum substrate temperature during treatment with an argon and oxygen plasma or helium and oxygen plasma.

| Offset (mm) | Speed (mm/s) | Temperature (1° C.) | |
| --- | --- | --- | --- |
| | | Argon | Helium |
| 3 | 2 | 110.6 | 132.3 |
| 3 | 5 | 105.4 | 122.7 |
| 3 | 10 | 95.9 | 113.1 |
| 5 | 2 | 93.7 | 123.4 |
| 7 | 2 | 79.1 | 115.2 |

It is likely that the higher plasma effluent temperature of the helium and oxygen plasma may be responsible for some of the difficulty in treating these materials, specifically the polymers. When a polymer experiences these high temperatures, the thermal energy allows the surface to more readily rearrange itself into a lower energy state similar to the untreated control. However, the most significant factor in the ability to process substrates at increased speed is due to the high concentration of reactive species generated with the argon plasma apparatus as described in this document. The combination of the low plasma effluent temperature and unexpectedly high reactive species concentration result in the ability of an embodiment of the invention to rapidly process a wide variety of materials. The materials discussed in the examples are not meant to be exhaustive, and many other substrates could be activated for bonding or coating. In addition, reactive gases such as nitrogen, hydrogen or others could be used to activate surfaces by someone practiced in the art.

Example 3

Method of Etching a Substrate

Another embodiment of the invention is etching of materials, including glass, metal and polymer films. For example, organic films may be etched by exposure to the argon and oxygen plasma. Whereas glasses, metals and metal oxides may be etched by exposure to the afterglow from the plasma apparatus fed with mixtures of argon and halogen-containing molecules, including, but not limited to, chlorine, nitrogen trifluoride, carbon tetraflouride, carbon tetrachloride, and sulfur hexafluoride.

Figure 23:
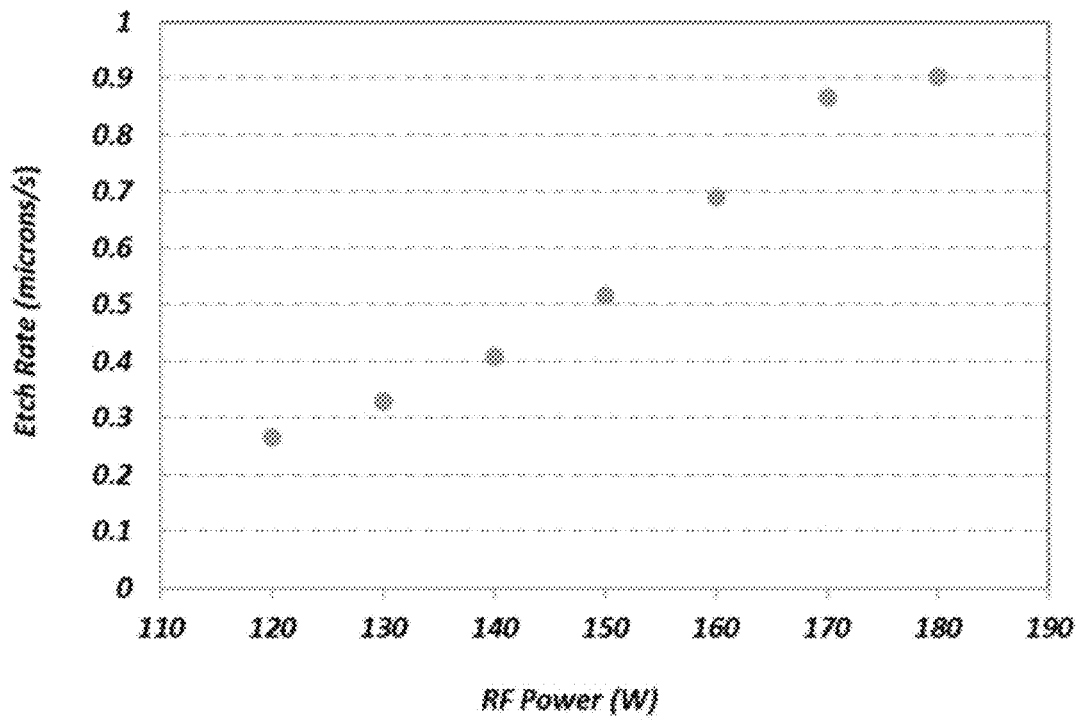
FIG. 23 is a plot of Kapton etch rate versus applied RF power with an atmospheric pressure argon/oxygen plasma.

Another aspect of the invention is embodied in a method of etching Kapton. The etch rate was determined by measuring the time necessary to etch a hole through a 25-micron-thick Kapton film. The Kapton film was placed over a vacuum chuck and a vacuum gauge was used to monitor the sudden change in pressure when the plasma etched through the film. A mixture of argon oxygen was fed into the plasma source and the trends in Kapton etch rate were measured by varying the process parameters, including applied RF power and argon flow rate. In the first experiment, the RF power sent to the plasma source was increased while keeping other variables constant. The oxygen flow rate was increased along with the RF power in order to maintain a stable plasma. During these experiments, argon flow rate was 15 LPM, the plasma source temperature was 60° C., the standoff distance was 2 mm from the device outlet to the film, and the Kapton was heated to 250° C. FIG. 23 shows how the Kapton etch rate is significantly increased by raising the RF power. An etch rate through the polymer of 0.9 microns per second was obtained at 180 W.

Figure 24:
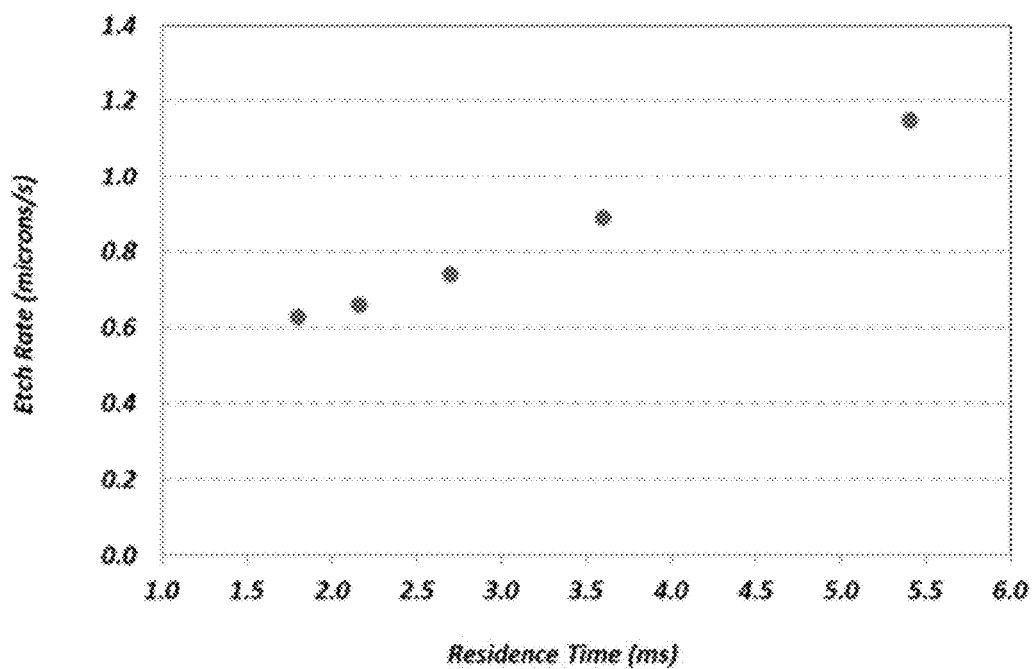
FIG. 24 is a plot of Kapton etch rate versus gas residence time with an atmospheric pressure argon/oxygen plasma.

In the second experiment, the RF power was kept constant while the gas residence time within the plasma was varied by changing the argon flow rate. The oxygen flow rate was also varied to maintain a constant gas composition of 6.8% oxygen. During these experiments, RF power was 180 W, plasma source temperature was 60° C., standoff distance was 2 mm from the device outlet to the film, and the Kapton was heated to 250° C. Argon flow rates of 30, 25, 20, 15 and 10 LPM were used to yield residence times of 1.8, 2.16, 2.7, 3.6 and 5.4 seconds, respectively. FIG. 24 shows how the Kapton etch rate increases with gas residence time. An etch rate through the polymer of 1.15 microns per second was obtained at a flow rate of 10 LPM or 5.4 seconds residence time.

The Kapton etch rates obtained with an embodiment of the invention may be compared to those achieved with atmospheric pressure plasmas described in the prior art. The etch rates reported in the literature are usually less than 0.1 microns per second. Gary Selwyn in U.S. Pat. No. 5,961,772 describes an atmospheric pressure plasma jet that is fed with 30 LPM of helium and 0.5 LPM of oxygen. This apparatus etched Kapton at 0.22 microns per second (13.5 microns per minute). It is evident that embodiments of the invention can yield an unexpected improvement over the prior art.

t should be noted that the method and apparatus describe herein is not limited to etching organic materials. Practically any inorganic material can be etched with an embodiment of the invention using halogen-containing feed gases, including molecules with chlorine, fluorine, or bromine atoms in them. In another embodiment, a plasma device may be used to etch many other materials, including, but not limited to, metals, metal oxides, glasses, semiconductors or ceramics. In the case of etching metals or semiconductors or ceramics, a gas containing chlorine or fluorine is added to the argon. When the plasma is initiated, the gas will be ionized creating a flux of fluorine or chlorine atoms capable of etching the substrate. For example, carbon tetrafluoride or sulfur hexafluoride may be added to the process gas stream to produce fluorine atoms which are capable of etching a substrate placed downstream of the plasma effluent. The only requirement is that the product of the reaction of the plasma with the inorganic material is a volatile metal halide (e.g., $MF_x$, $MCl_y$ or $MBr_x$), where M is derived from one or more components of the material. In another embodiment, the inorganic materials that may be etched with argon and fluorine containing plasmas include, but are not limited to, metals, metal oxides, metal nitrides, metal carbides, silicate glass, silicon nitride, silicon carbide, silicon, gallium arsenide and other semiconductors.

In an embodiment of the invention, inorganic oxide materials are etched away through a hydrogen reduction process. For example a flux of hydrogen atoms is generated in the plasma by feeding hydrogen gas mixed with argon. A metal or semiconductor substrate is placed downstream of the plasma discharge, so that only ground-state hydrogen atoms and neutral species impinge on the sample surface. These hydrogen atoms rapidly react with the oxide surface to generate a clean metal surface and water vapor as a byproduct. Embodiments of the invention allow for unwanted oxides to be removed from live electronic devices while avoiding ion bombardment and electrical arcing, which may damage the substrate. An alternative method of removing oxide layers from metals and semiconductors is to carry out this process in open air, where the plasma source generates a large flux of neutral hydrogen atoms allowing for rapid oxide removal, and eliminating any unwanted side reactions with the ambient air.

Figure 25:
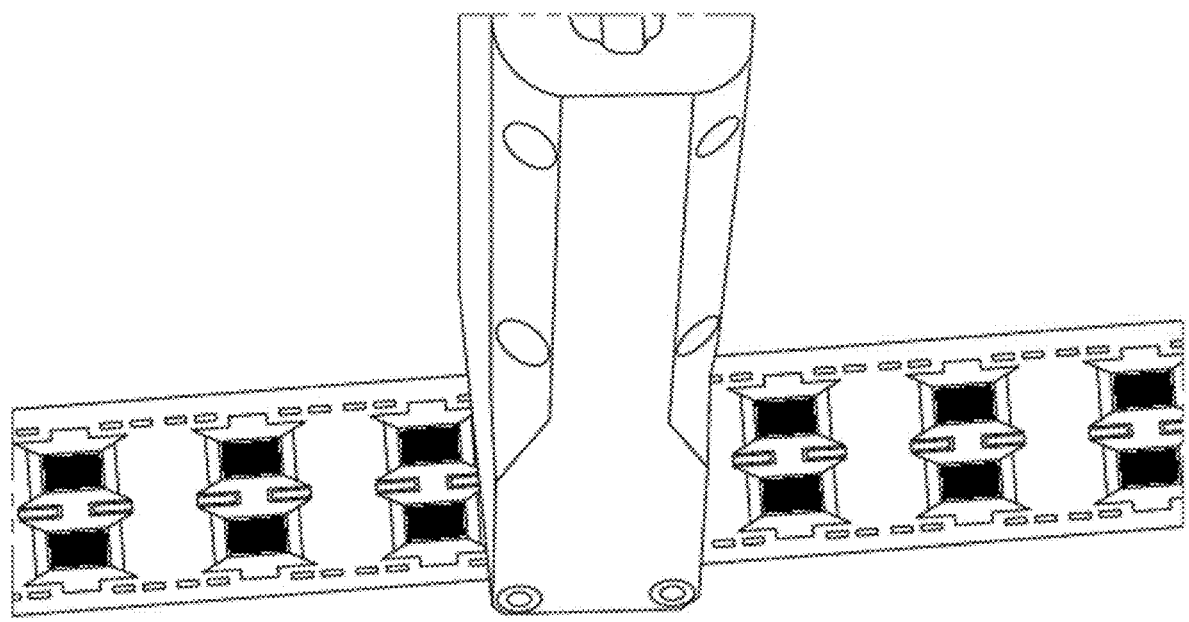
FIG. 25 shows an image of copper oxide reduction using an argon plasma fed with hydrogen.

One embodiment of the invention is a method of removing copper oxide from copper using the atmospheric pressure argon and hydrogen plasma. This embodiment was demonstrated on copper lead frames that are used in the semiconductor industry. The copper substrates were placed on a hot plate and heated to 180° C. At this temperature, a copper oxide film spread over the surface, which exhibits a characteristic purple color. Process gas containing a mixture of 15 L/min argon and forming gas at 1 L/min (95% nitrogen and 5% hydrogen) was fed to the one-inch-linear plasma source at atmospheric pressure. Radio frequency power at 160 W was applied to the electrodes, causing the plasma to be ignited and sustained. The plasma source was then mounted 2 to 3 mm above the oxidized copper surface. FIG. 25 shows copper oxide being removed with the argon and hydrogen plasma. In this image, the blue and purple coloration of the oxidized copper surface is readily distinguished from the shiny metallic copper surface produced after the hydrogen plasma has scanned over it from left to right.

Example 4

Method of Depositing a Thin Film

Another embodiment of the invention is a method of depositing thin films with the argon plasma at atmospheric pressure and low temperature. The embodiment has been reduced to practice by depositing glass-like films on silicon wafers. Here, a volatile chemical precursor is fed downstream at a second gas inlet located just after the exit of the plasma source. The volatile chemical precursor then combines with the reactive species in the afterglow of the plasma. The reactive species attack the chemical precursors, causing them to decompose and deposit a thin film on a substrate placed less than 1.0 centimeters downstream.

Figure 26:
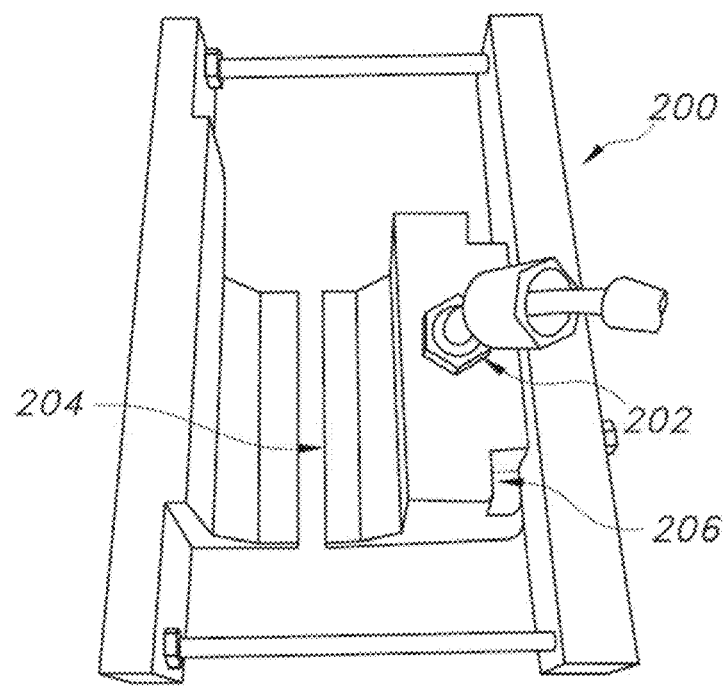
FIG. 26 shows an image of atmospheric pressure plasma attachment for depositing coatings onto a substrate.

In FIG. 26, an image is presented of a Teflon attachment to the atmospheric pressure plasma source (refer to FIG. 1B). A side-view of the attachment is presented in FIG. 27. This apparatus is another embodiment of the invention. It is mounted directly onto the plasma source housing, and provides a means of uniformly distributing the volatile chemical precursors into the reactive gas beam exiting from the linear argon plasma source. Volatile chemical precursors are fed into the attachment 200 at a top port 202, and out through a slit 204 in the side near the base of the Teflon piece 206. After exiting the attachment, the precursor chemicals efficiently mix with the reactive species in the afterglow. These species attack the chemical precursor, causing it to decompose and deposit a thin film onto a substrate located a short distance downstream.

The organosilane precursor chemical used in this example is tetramethyl-cyclotetrasiloxane (TMCTS) which is delivered just below the plasma source fed with argon and oxygen. The plasma was operating at 120 W RF power using 18 LPM argon and 0.2 LPM oxygen and the plasma deposition system was scanned over the surface at 25 mm/s. Tetramethyl-cyclotetrasiloxane was dispersed into the carrier gas and introduced to the apparatus through the attachment system located 1.0 mm away from the gas exit from the plasma housing. The precursor chemical was delivered to the attachment by flowing helium through a bubbler filled with the liquid precursor. The flow rate through the bubbler was set at 0.4 LPM and an additional dilution of 3.0 LPM of helium was added to this gas stream before entering the deposition attachment. Silicon wafers, 6 inches in diameter, were placed on a holder 7 mm downstream of the attachment. The pitch of the robotic painting program as it scanned the wafer was fixed at 1 mm. The total dwell time of the atmospheric plasma housing and attachment over the silicon wafers was varied by altering the number of deposition cycles.

Figure 27:
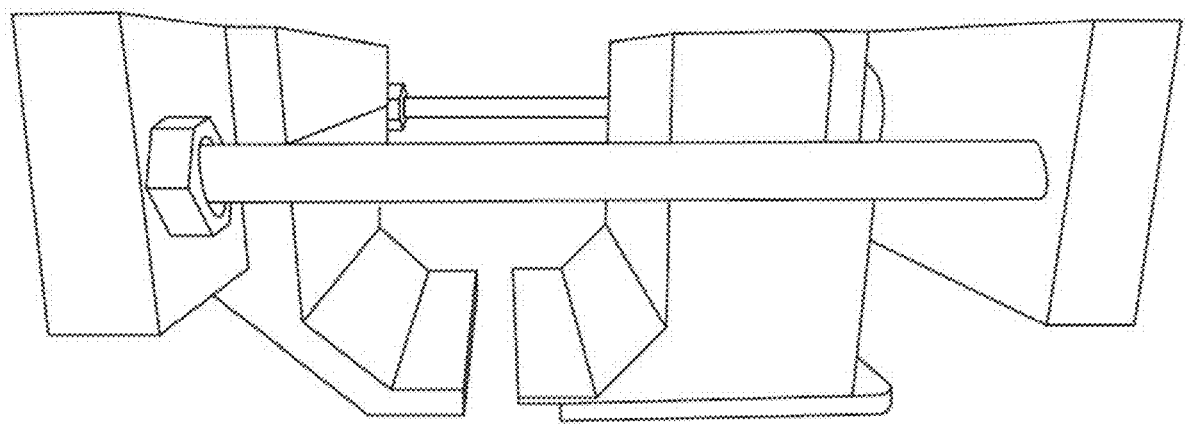
FIG. 27 shows a side view image of atmospheric pressure plasma attachment for depositing coatings onto a substrate.
Figure 28:
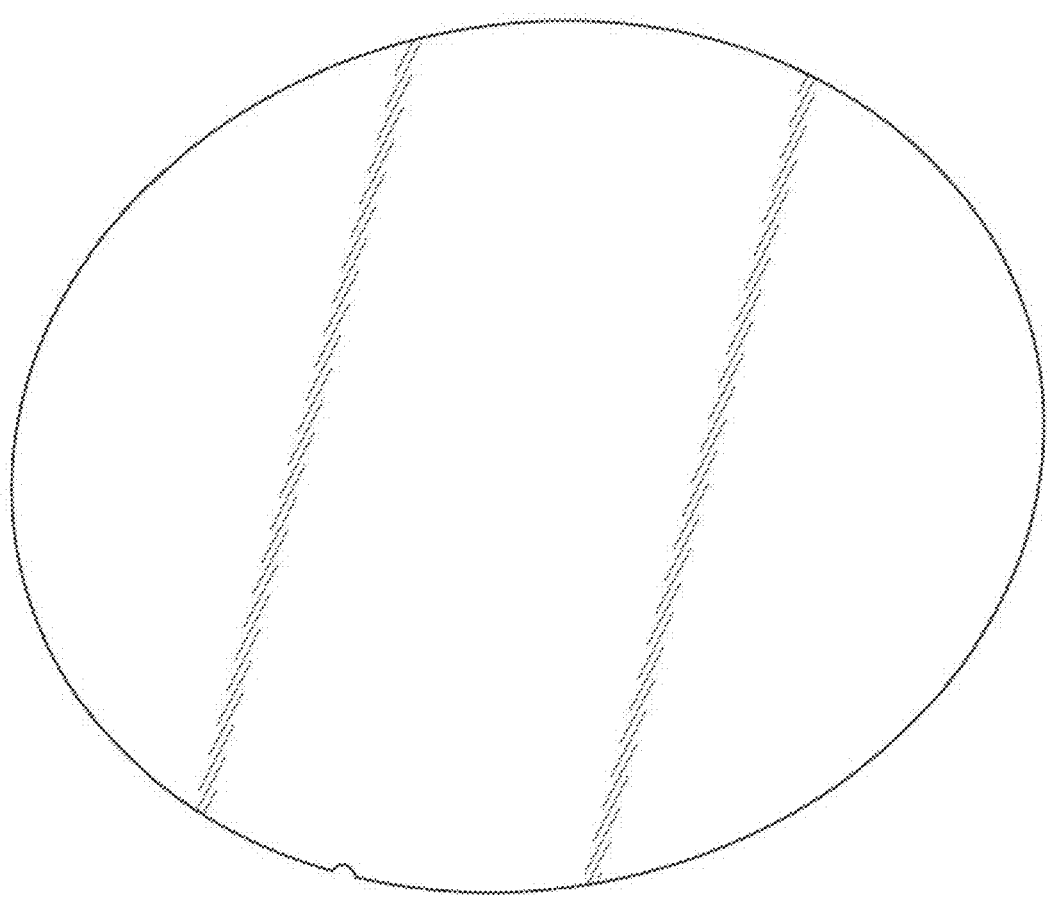
FIG. 28 shows an image of glass like coating deposited using the linear argon plasma deposition attachment.

FIG. 28 shows an image of a glass like coating deposited using the argon plasma apparatus with the attachment illustrated in FIGS. 26 and 27. Differences in coating thickness are apparent by observing the color of the thin glass film. Before deposition, the silicon wafer has a uniform silver color, which can be observed on the edges of the wafer in FIG. 28 where no scanning occurred. After deposition, one observes a bright blue coating generated by the deposited glass film. A color variation due to a thickness variation is observed at the edges of the film. However, over 90% of the film area, no significant variation in color is seen. This indicated a high degree of uniformity is achieved with the embodiment of the invention pictured in FIGS. 26 and 27.

Figure 29:
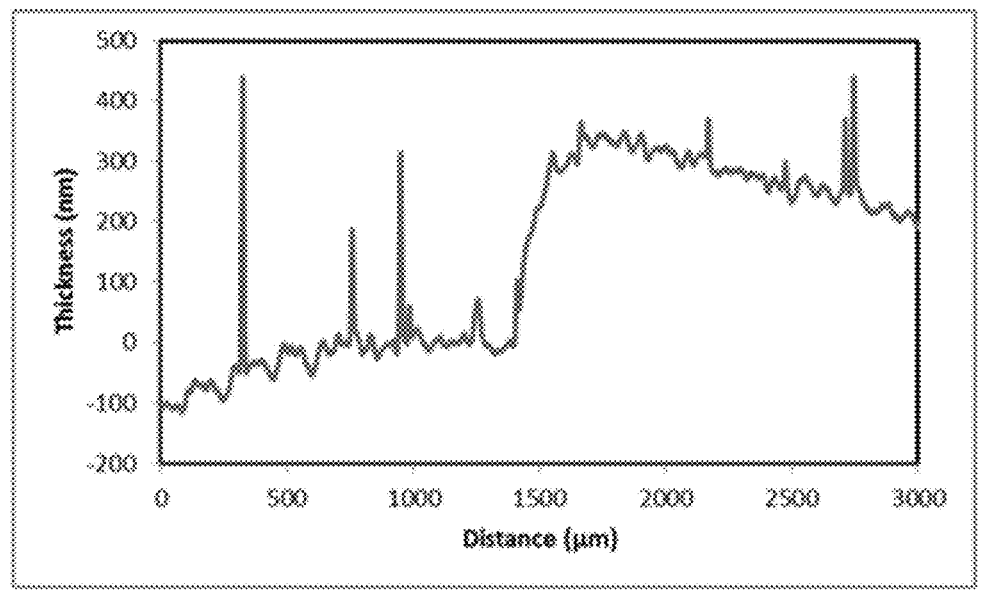
FIG. 29 is a plot of thickness for a glass-like coating deposited on a silicon wafer using TMCTS and an $Ar/O_z$ plasma.

Shown in FIG. 29 is an example of a thickness profile for the glass-like film deposited on the silicon wafer. A large change in height of ~350 nm is seen in the center of the graph from the bare silicon to the coated substrate, indicating the thickness of the coating. Other silane precursors may be used for this process, such as tetraethoxysilane, tetramethyldisiloxane, hexamethyldisilazane, trichlorosilane, and any volatile silane molecule containing ligands with C, O, N, H or Cl atoms, as understood by those skilled in the art.

Figure 30:
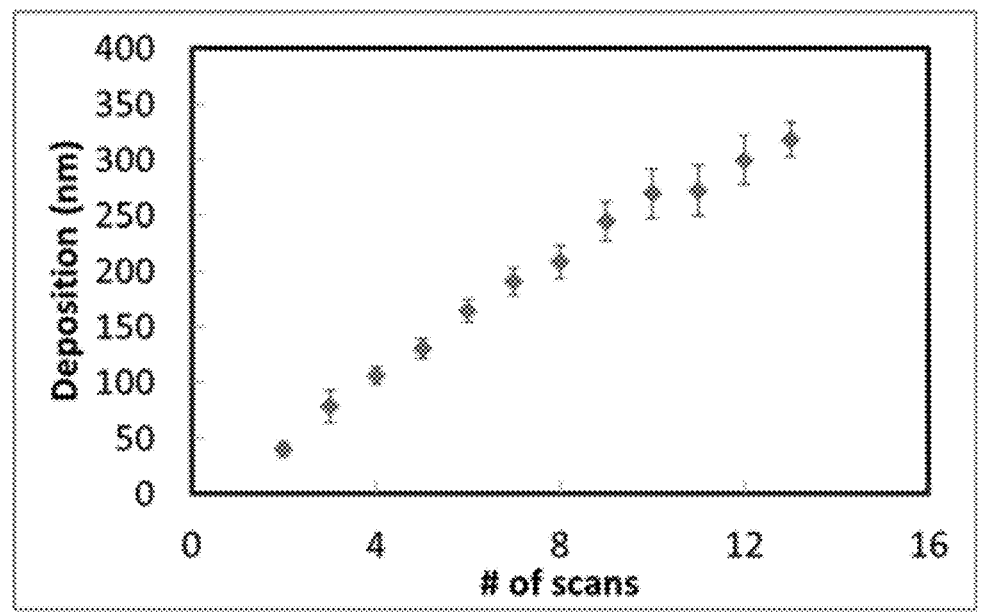
FIG. 30 is a plot of thickness for a glass-like coating deposited on a silicon wafer using TMCTS and an $Ar/O_2$ plasma.

Shown in FIG. 30 is the dependence of the average thickness of the glass film on the number of scans over the substrate. The average film thickness was determined by measuring the thickness across a step created by masking part of the substrate during deposition. The average thickness deposited per scan is 25 nm.

The rapid deposition rates achieved by this method are the result of the unusually high density of reactive species generated by this plasma as well as the novel method of delivering the volatile precursor which results in a more efficient conversion of the precursor compound into a coating. In addition, the linear argon plasma deposition apparatus promotes films that contain far fewer particulate impurities, and provides a smoother, uniform and conformal coverage of any features present on the substrate.

Another aspect of the invention shown in FIGS. 26 and 27 is that it requires much less cleaning than the prior art (for example, Babayan and Hicks, U.S. Pat. No. 7,329,608, Feb. 12, 2008). In the prior art, the deposition design necessitated cleaning of the mixing chamber every few hours in order to open up holes in the showerhead that become clogged during operation. This embodiment of the invention can be practiced for many hours and even days of continuous operation without needing to be cleaned.

The attachment to the linear plasma source contains several novel features that allow it to be operated for many hours without needing to be cleaned. First, the attachment is machined from Teflon. This material is inert and resists adhesion of any coating to its surface. This has the effect of retarding the accumulation of partially decomposed precursor material on this component and of reducing the number of particles that adhere before being blown downstream. Teflon was used in this example, but any inert, low-surface-energy material will have the same effect.

The second novel feature is the ability to prevent unwanted coating forming on the walls or exit ports of the mixing chamber. The previous art required the reactive plasma gas to mix with the precursor chemicals in an enclosed chamber. This resulted in a constriction in the diameter of the exit holes for the chamber as the system was being used for deposition. The clogging of these holes during operation required frequent maintenance to clean out unwanted material. This embodiment of the invention provides a means for the plasma afterglow and the precursor to mix out in the open, where there are no nearby walls to contact before reacting and impinging on the substrate.

This example demonstrates another embodiment of the invention. The linear argon plasma attachment may be used to deposit practically any organic or inorganic thin film in the manner described above without departing from the scope of the invention. The only requirement is that the elements required in the film can be fed to the reactor through a volatile chemical precursor. Materials that may be deposited with this device or reactor include, but are not limited to, polymers, metals, metal oxides, metal nitrides, metal carbides, silicate glass, silicon nitride, silicon carbide, and silicon, gallium arsenide, gallium nitride, and other semiconductors. Examples of polymer films that may be deposited by this embodiment of the invention include, but are not limited to, polyethylene, polytetrafluoroethylene, and polyaniline.

The chemical precursor fed into the deposition system may also be a volatile organometallic compound of formula $ML_n$, where M is a metal atom, L is a ligand bound to the metal atom, and n is the number of ligands. To be a chemical precursor for the plasma-enhanced deposition of thin films, the organometallic compound should be volatile, stable enough to transport in the vapor from the storage container to the plasma device, and decompose without depositing unwanted impurities in the film. Suitable organometallic compounds are generally having ligands that are alkyls, alkoxides, halogens (e.g., chlorine), organic amines, phosphines, and carbonyl groups. Other ligands may be used and would be understood by those skilled in the art.

Examples of metals that may be deposited by an embodiment of the invention include, but are not limited to, tungsten, titanium, copper, platinum, and gold. In the deposition of polymers and metals, it may be advantageous to feed hydrogen to the plasma source, and have the H atoms produced thereby react with the chemical precursor and deposit the desired film.

Specific metal oxides, nitrides and carbides that may be deposited by an embodiment of the invention include, but are not limited to, zirconium oxide, tantalum oxide, titanium oxide, hafnium oxide, aluminum oxide, zinc oxide, indium-tin oxide, silicon nitride, titanium nitride, boron nitride, gallium nitride, silicon carbide, and tungsten carbide. For the deposition of metal oxides, nitrides and carbides, it may be desirable to feed oxygen, nitrogen, and acetylene, respectively to the atmospheric pressure plasma. The O, N or C atoms generated in the plasma will react with the chemical precursor and deposit the desired oxide, nitride or carbide thin film.

Embodiments of the invention can be used to deposit semiconductors as well, including, but not limited to, polycrystalline silicon, amorphous hydrogenated silicon, gallium arsenide, and indium phosphide. As an example of how to deposit amorphous hydrogenated silicon, one would feed to the plasma hydrogen and argon gas, then combine the effluent from the plasma with silane, and impinge this reaction mixture onto a heated glass substrate. A wide variety of films may be deposited using the principles herein, and would be understood to those skilled in the art.

Example 5

Method of Cleaning and Activating a Metal Substrate

Another embodiment of the invention is a method of cleaning and activating metal substrates with argon plasmas at atmospheric pressure and low temperature. Metal oxides may be reduced by exposure to the afterglow from the plasma apparatus fed with mixtures of argon and reducing molecules, including, but not limited to, hydrogen, ammonia, forming gas, carbon monoxide, and hydrogen sulfide. The embodiment has been reduced to practice by demonstrating the removal of copper oxide from copper and indium oxide from indium by exposure to an argon and hydrogen plasma.

Copper, silver, gold and related metals and alloys are an important material in integrated circuits and electronic assemblies. These metals form the circuits that conduct the electrical signals to and from the solid-state devices. Silver and copper are attractive alternatives to gold because of their lower material cost, but these metals are also more prone to corrosion. The presence of surface contamination and the formation of oxides on these metals lead to reliability problems during die attach, wire bonding, molding, and other processing steps. Maintaining surface cleanliness and eliminating surface oxidation during semiconductor packaging is key to obtaining a reliable integrated circuit.

The apparatus and methods described herein are well suited for cleaning and deoxidizing metals, especially copper, silver, gold, indium, tin and others. Here, a reducing gas, such as hydrogen, is fed into the active region of the argon plasma. The $H_2$ molecules are split apart by free electrons in the discharge to form hydrogen radicals. These species exit the plasma head and impinge on the metal substrate, which is placed between 1 and 10 millimeters downstream of the head. The hydrogen radicals reduce the metal oxide by chemically reacting with the bound oxygen atoms to form water vapor, leaving behind only the metal. The water vapor is a volatile molecule that desorbs from the substrate and is swept out in the exhaust stream. The hydrogen radicals remove the oxide layer by layer until a pristine metal surface is left behind.

In one of the embodiments of the invention, metal oxide reduction is accomplished under ambient conditions without any risk of explosion. This is because the hydrogen is fed into the argon discharge at concentrations below 2.0 volume % with the balance being inert argon gas. This concentration is below the flammability limit of hydrogen in air.

The oxide reduction process can be performed at low temperature so that there is no subsequent re-oxidation of the metal by the surrounding air. The gas temperature of the plasma can be maintained at a temperature of less than 100° C.

In addition, the substrate can be externally heated so as to increase the rate of metal oxide reduction. Placing the samples into a chamber free of air or oxygen allows the plasma to rapidly reduce the metal oxide without any re-oxidation of the surface after the plasma beam has scanned over the substrate.

Embodiments of the invention described herein utilizes a purely chemical process. The surface contaminants are converted into volatile products by reaction with the active species produced by the plasma. Using this technique, there is no physical sputtering of the material, since the substrate is placed downstream outside of the plasma zone and is not directly exposed to the ionized species. By eliminating sputtering of the substrate, complex electronic devices can be processed without causing any physical damage to them.

The ionized gas discharge is electrically isolated from the metal substrate that is being processed downstream of the plasma head, In addition, the electric field used to generate and sustain the plasma discharge is contained within the plasma head. This means that integrated circuits and other live electronics are cleaned and activated without the plasma interfering with device performance.

Figure 31A:
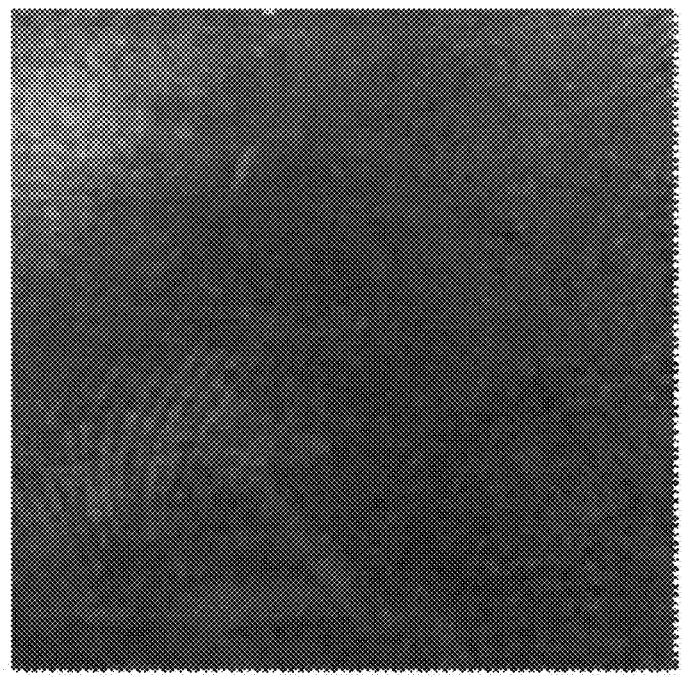
FIGS. 31A and 31B show optical images of an annealed copper heat sink before and after oxide reduction by the argon and hydrogen plasma.
Figure 31B:
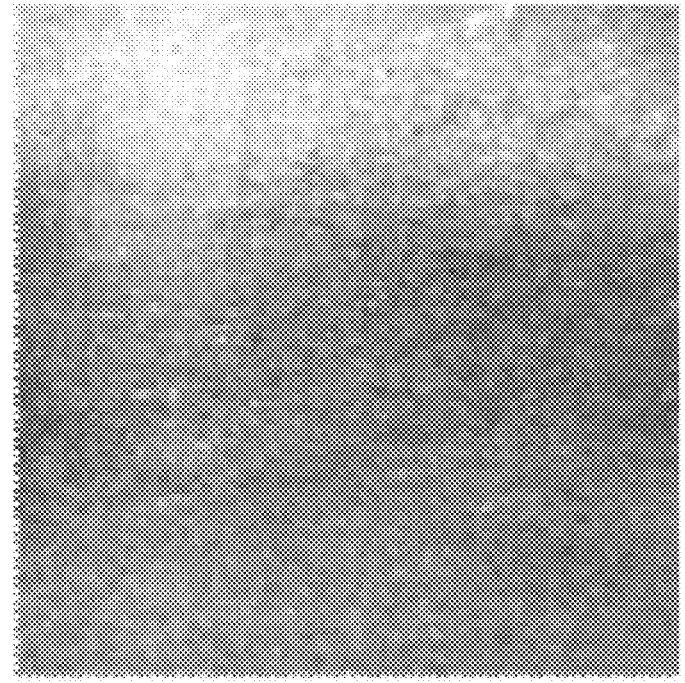

Several experiments have been performed to demonstrate the capabilities of the plasma device and method to reduce metal oxides back to pure metal. In the first example, tests were performed on copper heat sinks. The copper heat sinks were oxidized through a 150° C. annealing process. The copper oxide had a purplish red color that easily distinguished it from the shiny copper metal surface. An atmospheric pressure plasma was generated with a gas mixture of argon and hydrogen. The plasma head was then scanned over the copper heat sink at a distance of 2 mm above the surface. The argon flow rate in the 25-mm linear beam source was 10.0 liters per minute (LPM), the hydrogen flow rate was 0.2 LPM, and the power was 150 W. After exposure to the plasma, the purple oxide tarnish was removed. FIG. 31A shows an optical image of an annealed copper heat sink before oxide reduction by the argon and hydrogen plasma. FIG. 31B shows an optical image of an annealed copper heat sink after oxide reduction by the argon and hydrogen plasma.

The generation of a stable plasma with argon and 1.96 volume % hydrogen at atmospheric pressure is new and unexpected. Atmospheric pressure for these experiments was between 750 and 760 Torr. Accordingly, the partial pressure of hydrogen in the plasma was between 14.7 and 14.9 Torr. Hydrogen and argon plasmas described in the prior art operate under vacuum conditions, where the total pressure is between 0.1 and 0.5 Torr (see Lieberman and Lichtenberg, "Principles of Plasma Discharges and Materials Processing", (John Wiley & Sons, Inc., New York, 1994). In order to avoid the possibility of an explosion by air leaking into the vacuum plasma, the hydrogen concentration in the gas feed must be kept below 4.0 volume %. In this case, the partial pressure of hydrogen in the vacuum plasma is between 0.004 and 0.02 Torr. This partial pressure of hydrogen is almost one thousand times less than in the argon and hydrogen plasma described in the previous paragraph. The copper oxide removal rate is proportional to the amount of hydrogen atoms produced by electron impact dissociation of hydrogen molecules in the gas discharge. Therefore, one may conclude that the argon and hydrogen plasma at atmospheric pressure, as described in this embodiment of the invention, is close to 1,000 times faster at etching copper oxide from copper than argon and hydrogen plasmas described in the prior art.

This embodiment of the invention, whereby metal oxide layers are removed from metal substrates by exposure to the argon and hydrogen plasma, may be distinguished from prior art atmospheric pressure plasmas, such as the Plasmaflume or Open-air plasma sold by Plasmatreat. These prior art plasmas operate with air as the main gas feed. Hydrogen cannot be fed to these plasmas without being immediately consumed to produce water as a byproduct. The air feed to the plasma will produce an excessive amount of reactive oxygen that will overwhelm the hydrogen, and lead to further oxidation of the copper (Cu) to copper oxide (CuO), instead of reduction of the copper oxide to copper.

Figure 32:
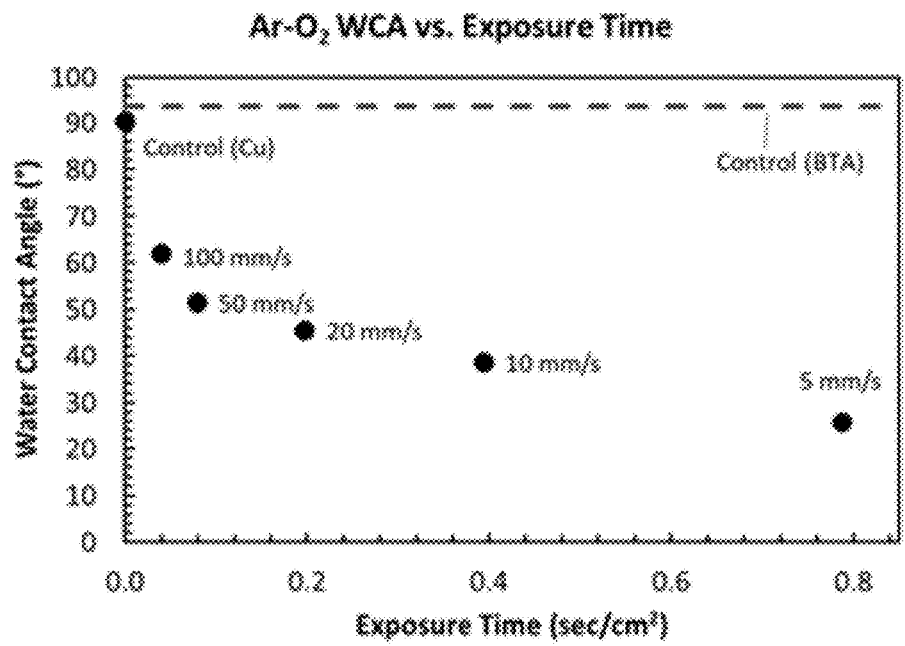
FIG. 32 is a plot of water contact angle as a function of plasma exposure time for a copper lead frame using the argon and oxygen plasma.

The argon plasma may be used to improve the adhesion of coatings and glues to metal surfaces. Copper surface activation was accomplished using the argon and oxygen plasma. The plasma scan speed over the substrate was varied from 5 to 100 millimeters per second, and the water contact angle of the copper was measured after each scan. These results are presented in FIG. 32. High-speed surface activation was achieved. A 43% reduction in water contact angle was observed at a speed of 50 mm/s. The water contact angle was reduced from 91° to 26° when the plasma scan speed was 5 mm/s. A low water contact angle is indicative of a hydrophilic surface. Such a surface should make strong bonds to coatings and glues.

Figure 33:
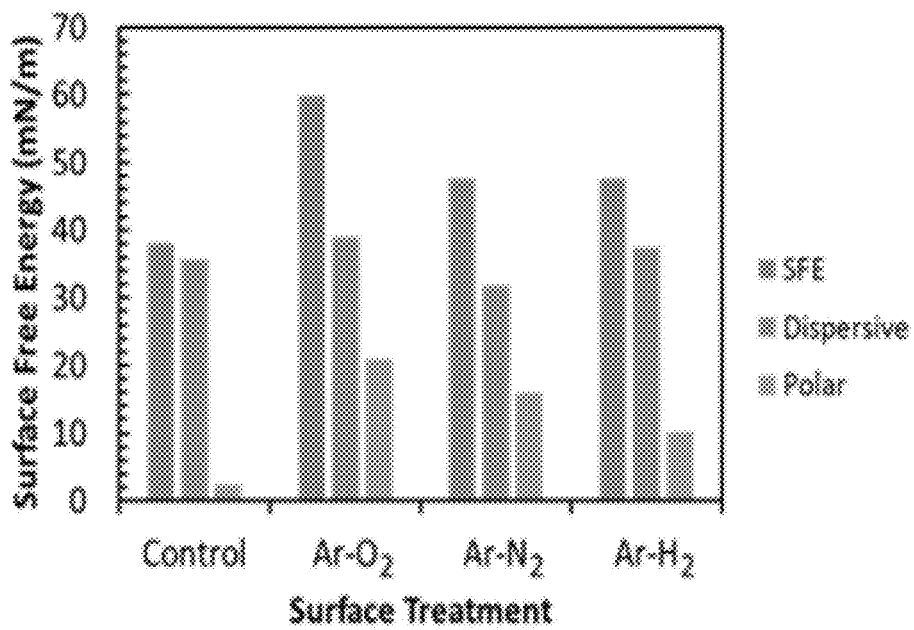
FIG. 33 shows a bar graph of the surface free energy, including the dispersive and polar component, for a copper lead frame using $Ar$—$O_2$, $Ar$—$N_2$, or $Ar$—$H_2$ plasmas.

The atmospheric pressure argon plasma removes organic contaminants from metal surfaces, and thereby increases the metal surface energy so that it will strongly bond to other materials. A copper lead frame was exposed to an argon plasma that was additionally fed with oxygen, nitrogen or hydrogen. After plasma treatment, the surface free energy (SFE), along with the polar and dispersive components of the SFE, was measured with a Krüss Mobile Surface Analyst. The results of these experiments are shown in FIG. 33. Exposure to the argon and oxygen plasma increased the polar component of the surface energy from <3 mN/m to 21 mN/m. Substantial increases in the polar component of the SFE was observed with the argon and nitrogen plasma and the argon and hydrogen plasma, although to a less extent than achieved with the argon and oxygen plasma. A large increase in the polar component of the surface energy is a good indication that the copper is activated for bonding to other materials.

Figure 34:
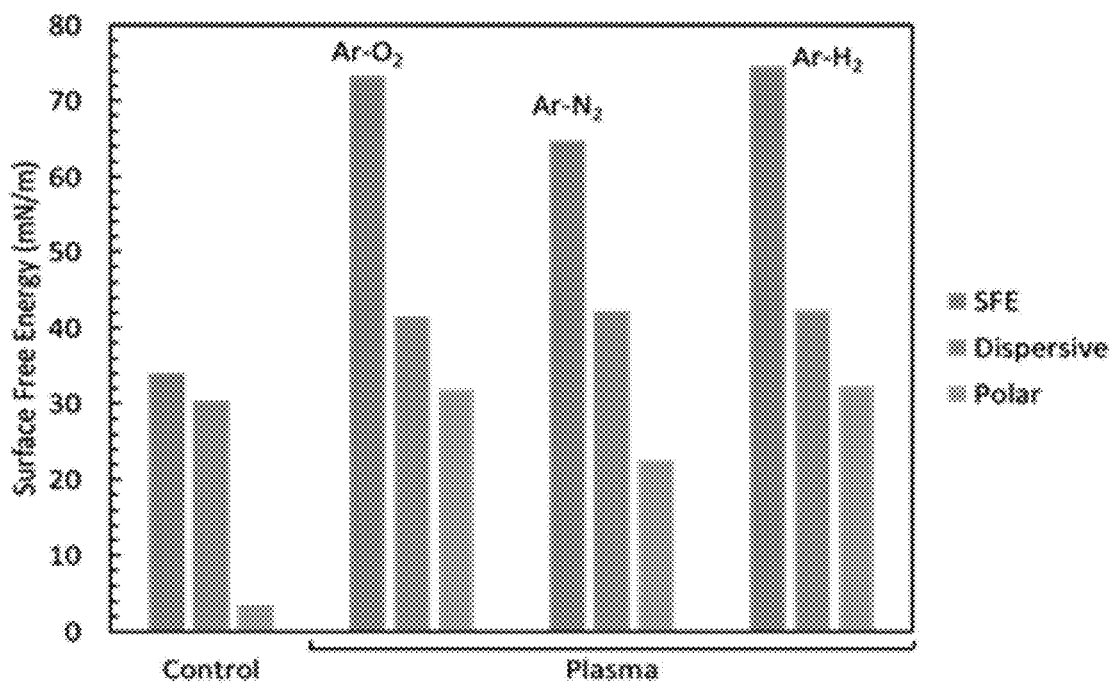
FIG. 34 shows a bar graph of the surface free energy, including the dispersive and polar component, for a nickel-phosphorus coated lead frame using $Ar$—$O_2$, $Ar$—$N_2$, or $Ar$—$H_2$ plasmas.

Measurements made on a nickel-phosphorus plated lead frame also showed a large enhancement in the surface free energy after plasma treatment. The water contact angle decreased to less than 20° after treatment with argon and oxygen, argon and nitrogen, and argon and hydrogen plasmas. The total surface free energy increased from 34 mN/m to 73 mN/m for the Ar—$O_2$ and Ar—$H_2$ plasmas, and from 34 mN/m to 65 mN/m for the Ar—$N_2$ plasma. Argon-oxygen plasma cleaning of the nickel-phosphorus surface increases the polar component of the SFE from 4 mN/m to 31 mN/m. Similar surface energy values were achieved when using the other atmospheric pressure argon plasmas. FIG. 34 shows a bar graph of the surface free energy, including the dispersive and polar components, obtained before after treatment of the nickel-phosphorus coated lead frame.

X-ray photoemission spectroscopy (XPS) of the nickel-phosphorus substrate revealed that the plasma cleans the surface by removing carbon-based contamination. The argon-nitrogen plasma was shown to reduce the carbon concentration on the surface from 46% to 35% (refer to Table 3). However, the nickel-phosphorus surface was best cleaned with the Ar—$O_2$ plasma, which reduced the carbon concentration to 23% following treatment. At the same time, the oxygen concentration on the Ni—P surface increased from 31% to 50%, and the nickel concentration on the Ni—P surface increased from 11% to 27%. Evidently, before exposure to the plasma, a substantial amount of nickel metal was buried underneath the contamination.

TABLE 3

Atomic composition of nickel-phosphorus surface after treatment with the argon and oxygen plasma and the argon and nitrogen plasma

| | Atomic Fraction (%) | | | |
|---|---|---|---|---|
| Surface Prep | C | O | Ni | P |
| Control | 46 | 31 | 11 | 13 |
| Ar—$N_2$ Plasma | 35 | 41 | 14 | 11 |
| Ar—$O_2$ Plasma | 23 | 50 | 27 | 11 |

Figure 35:
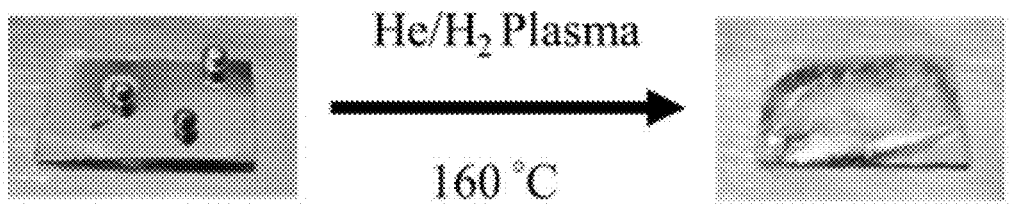
FIG. 35 shows indium solder bumps on a gold foil substrate before (left) and after (right) plasma treatment on a stage heated to 160° C.

To further demonstrate the metal oxide removal process, the invention was demonstrated on indium solder balls using the argon and hydrogen plasma at atmospheric pressure. Indium solder bonds to gold are produced by heating indium metal past its melting temperature of 156° C. However, if too much indium oxide is present on the solder balls, a skin is form over the molten indium that prevents it from sticking to the gold. Note that indium oxide does not melt until 1,910° C. An experiment was performed in which indium solder balls were placed on a gold foil that was then heated to a temperature of 160° C. Due to the presence of indium oxide on the surface of the indium balls, they did not wet out over the gold. A picture of the balls on the hot gold foil is shown on the left side of FIG. 35. Upon exposing the solder balls to the argon and hydrogen plasma, the oxide skin was removed and the liquid indium spread over the gold surface, as seen on the right side of FIG. 35.

For certain applications, it may be necessary to remove a passivation layer from the metal surface. The process can be performed in two stages, using oxygen plasma to remove the organic layer, followed by hydrogen plasma to remove the oxide. Several experiments were performed to show that benzotriazole (BTA) coatings on copper lead frames could be removed using the argon and oxygen plasma. Then argon and hydrogen plasma treatment was performed to remove any surface oxidation. X-ray photoemission measurements confirmed that the two-stage plasma process removed the BTA and yielded a clean copper surface. Presented in Table 4 is the surface composition of the substrate before and after plasma etching of the BTA. The BTA coating is evident by a surface concentration of carbon and nitrogen of 72% and 7%, respectively. After oxygen plasma treatment, the surface concentration of carbon dropped to 28% and that of nitrogen to 0%. The elimination of nitrogen from the surface suggests that the BTA was completely removed. This conclusion is further supported by the large increase in copper observed by the XPS, from 4% before processing to 15% afterwards.

TABLE 4

Atomic composition of a BTA copper lead frame surface before and after treatment etching with an argon-oxygen plasma

| | Atomic Fraction (%) | | | | |
|---|---|---|---|---|---|
| Surface Prep | C | O | N | Cu | Ca |
| BTA Coated | 72 | 16 | 7 | 4 | 2 |
| Ar—$O_2$ Plasma | 28 | 56 | — | 15 | 1 |

Figure 36:
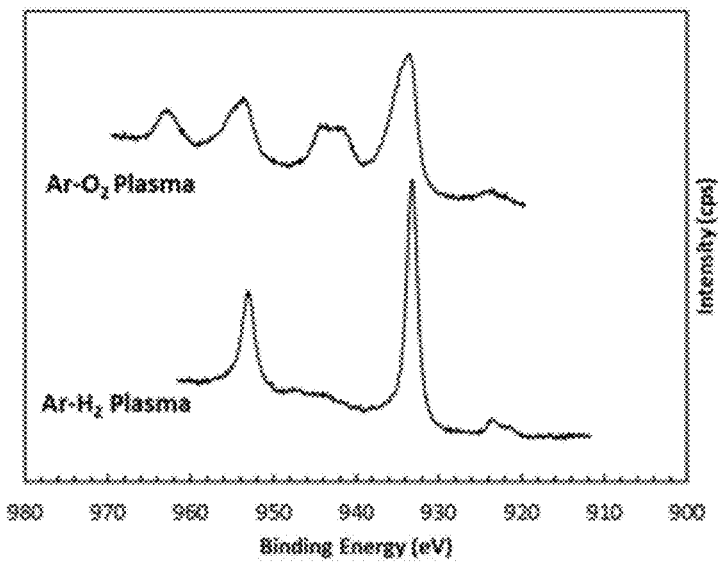
FIG. 36 presents the Cu 2p X-ray photoemission spectra of a copper lead frame after treatment with the argon and oxygen plasma and with the argon and hydrogen plasma.

High resolution XPS measurements of the copper $2p$ photoemission peaks confirmed that the copper oxide (CuO) was removed from the copper lead frame following exposure to the argon and hydrogen plasma. The XPS spectra of the Cu 2p peaks after Ar—$O_2$ and Ar—$H_2$ plasma treatment are presented in FIG. 36. Copper oxide, $Cu^{2+}$, is indicated by the presence of a broad peak for Cu $2p_{3/2}$ between 932 and 938 eV, and an intense satellite band between 940 eV and 946 eV. Following treatment with the hydrogen plasma, the $Cu^{2+}$ copper oxide has been completely eliminated. This is evident by the narrow Cu $2p_{3/2}$ peak, and the complete absence of the satellite.

Further embodiments of the invention include the removal of metal oxide layers from other metals as well, including, but not limited to, platinum, palladium, nickel, gold, silver, indium, gallium, lead, tin and alloys containing these elements. In addition, plasma activation for improved adhesion can be accomplished on many metals, such as copper, silver, nickel, aluminum, titanium and steel, where removal of the oxide is not necessary. As an example, a copper lead frame could be activated for increased adhesive strength to epoxy molding compounds without needing to remove the copper oxide from the surface. A wide variety of metals can be processed using the principles herein, and would be understood to those skilled in the art.

Apparatus and methods for generating a low-temperature, atmospheric-pressure argon plasma are disclosed. A plasma apparatus with auto-tuning and temperature control methods has been developed which produces stable argon plasmas that may be used to process materials at atmospheric pressure and low temperature. The device contains a means for controlling the temperature of a flowing gas and a means for partially ionizing said flowing gas such that uniform and stable plasmas are generated. In addition, a means has been developed for automatic tuning of the electrical network to match 50-Ohm impendence. In another embodiment of the invention a ultraviolet-visible spectrometer has been integrated into the plasma source which allows for monitoring of the reactive species generated by the plasma. Furthermore, embodiments of the invention include processes that employ the argon plasma apparatus to treat materials at low temperature and high throughput and at a cost which has been previously unavailable. One method use the argon plasma device to remove organic materials. The methods further cover the robotic and handheld application of the low-temperature, atmospheric pressure plasma to activate the surface of materials. Oxygen is added to the argon gas flow, which is converted with the action of the plasma into a beam with a high concentration of reactive species. A hydrophobic surface can be converted to a hydrophilic state through exposure to the reactive gases in the afterglow of the plasma. The resulting hydrophilic substrate can better accept adhesives, paints, inks and coatings, which will adhere and be brought into intimate contact with the surface. In another embodiment, the argon plasma is fed with halogen-containing molecules, including $CF_4$, and generates free fluorine atoms, which etch metal, organic and ceramic substrates. Another embodiment of the invention uses the argon plasma with hydrogen gas feed to remove copper oxide films from copper metal in an open-air environment. In another embodiment the argon plasma is combined with a means of introducing chemical precursors to the system thereby causing the plasma-enhanced chemical vapor deposition of a thin film onto a substrate.

Tuning to Minimize Reflected Power and Target Forward Power

An exemplary embodiment of the invention can employ the RF system used in the Atomflo 500 controller designed to operate with a nominal 50 ohm load at 13.56 or 27.1 MHz. The actual RF load (RF cable assembly and plasma head) can vary (and certainly not equal 50 ohm) depending on the plasma head in use, the plasma gas and process gas (and their flowrates) and the recipe power settings selected.

The tuning network is included in the Atomflo 500 controller so that together with the RF cable set and plasma head, they match the required 50 ohm load. The tuning network has two adjustable capacitors (load and phase) to allow it to adjust the load on the RF system so that it always appears as 50 ohms when different plasma heads and/or recipe settings are used. In addition to this, these adjustable capacitors are adjusted to positions to yield a high voltage potential within the plasma head when first initiating plasma (i.e. striking plasma).

The tuning network can serve to minimize reflected power and target forward power. One example method used for tuning employs forward and reflected power feedback from the mini-coupler to determine the forward power set point error and reflected power target error. It then uses this error information and the tuning coefficients to determine how far (and in which direction) to move the phase and/or load capacitor.

The total move size (based on the error information) for the load and phase capacitors is determined and then the load and phase capacitors are moved a limited amount (each moved ratiometrically in relation to the determined total move size) before the forward and reflected power (and error information) is re-evaluated. This limited move size is made larger, when the reflected power error is large and smaller when the reflected power is close to the target reflected power. Therefore, the tuning occurs in many (larger at first, then smaller) discrete steps.

Even when both the forward power and reflected power are within their tuning window, the tuning will continue until they are both within their windows for the tune stabilization time. This is done to ensure the final tune approaches the middle of these tuning windows.

The forward and reflected power error may be constantly used to modify the phase and load capacitor motor speed until these errors reach zero, and the system is in tune. This can be accomplished by simultaneously commanding motor movement, and read forward and reflected power in real time. Firmware can enable this approach to yield a significant improvement to tuning speed.

When operating using helium as the plasma gas, the reflected power can be reduced to a minimum (normally at or near zero watts reflected power) by adjusting the phase and/or load capacitor in a given direction before the reflected power starts to increase again. When this happens, the forward power typically begins to fall as the VSWR increases. This situation can be referred to as: tuned to "the wrong side of zero" and tuning should be stopped when the reflected power is close to zero. Interestingly, with some plasma and process gas flow rate settings, the minimum reflected power that is achieved may not be near zero watts.

When operating using argon as the plasma gas, the plasma can normally only be tuned until the reflected power is at or close to zero, and it is not possible to tune to the "wrong side of zero" because the VSWR increases so rapidly "on the wrong side of zero" that the plasma extinguishes.

Finally, the phase and load capacitors are adjusted by rotating their moving plates within their operating range. As the capacitor is adjusted and it's moving plates are moved within the range of the fixed plates, the capacitance increases. However, once the moving plates are fully aligned with the fixed plates, further rotation will begin to decrease the capacitance (i.e. the capacitor is moved beyond its operational range). The opposite occurs as the moving plates move beyond a position where the moving plates are not engaged at all with the fixed plates (i.e. fully disengaged). Due to variations in production tolerances and other factors, capacitor movement may be left without stops within their expected operational range via the firmware. Therefore, in situations where the adjustable capacitor positions are close to (or beyond) their operational range when being tuned for a given setup (head type, plasma gas flow rate, process gas flowrate, RF cable length, etc.), tuning may cause the capacitance to decrease instead of increase (or visa-versa) and result in the reflected power increasing while the tuning algorithm is attempting to decrease it.

To counter the problem of tuning "on the wrong side of zero," or attempting to tune beyond the tuning range of the capacitors, a check is made during tuning to ensure the reflected power decreases when moves are being made to do so. If the reflected power is seen to increase when moves are being commanded to decrease it, an "escape" sequence is instigated. The "escape" sequence moves the phase capacitor (in a positive direction) until the reflected power is 10 watts above the targeted tuning value for reflected power ([reflected power max−reflected power min]/2). Once in this position, it then reverts to the normal tuning method. When executing the escape move, the system will emit a "beep" from the audible alarm (if enabled) to alert the user that this is happening.

Note that not all gas combinations and/or flow rate settings (for these gasses) and/or power set points will be tunable. It is recommended that nominal recipe settings are employed for reliable use. The RF cable length (between the controller and plasma head) also has a significant effect on the tuning range of the plasma system.

In most cases, the escape sequence will never be initiated as tuning occurs normally without a problem. However, slightly non-ideal recipe settings will be catered for with one (or perhaps a few) escape sequence actions during tuning. If the system appears to be constantly oscillating between being almost tuned and being at a reflected power of around 12 W (as the escape sequence is constantly instigated), the recipe settings and/or the tuning coefficients may need changing, or it may not be possible to run those recipe settings with that head.

Tuning coefficients are employed in the operation of the tuning algorithm. Adjusting the phase capacitor changes the forward power and the reflected power. Adjusting the load capacitor also changes (by a different amount) the forward power and reflected power. The amount that the forward and reflected power changes (i.e. the tuning responses) with adjustments to the load and phase capacitor is stored as tuning coefficients. The tuning coefficients are stored in the controller configuration file.

The tuning responses (forward and reflected power changes with adjustments to the load and phase capacitors) are not the same for all plasma heads and recipe settings but they have been found to be similar. Therefore, an average set of tuning coefficients have been determined that are suitable for linear heads using argon with oxygen or nitrogen over a range of power settings. Such settings can also be employed with linear heads using helium with oxygen or nitrogen as well as the universal mini-beam head. However, it may be possible to get a slight improvement in tuning capability for a given head if new tuning coefficients are determined and saved for that specific head type running a specific set of recipe settings. In fact, it may be necessary to determine new tuning coefficients if a new type of head is developed or some other gas combination (e.g. argon with hydrogen) is used.

Note that the tuning coefficients are stored in the controller configuration file and therefore apply to all heads and all recipes on a given controller. If two types of plasma heads, each require separate specific tuning coefficients for optimal tuning, a compromise of tuning coefficients may need to be determined as only one set of coefficients are stored.

The tuning coefficients for a given head and recipe settings can be found by first "mapping" the response of forward and reflected power, when adjusting the phase and load capacitor around the ideally tuned capacitor positions.

This mapping involves first finding the tuned capacitor positions, i.e. finding the capacitor positions where the forward power matches the set point forward power and the reflected power is around 2 W. This can be done either automatically using the current tuning coefficients or manually. Then the phase capacitor is adjusted in small increments (e.g. by 2 degrees) until the reflected power is greater than 10 watts and the forward power error is greater than +10 watts, while leaving the load capacitor position unchanged. At each of these increments, the capacitors positions, forward and reflected power are recorded. The same is done for the load capacitor, so four graphs are created and the slopes of the lines on these graphs are determined. The four graphs are: change in reflected power/change in load capacitor angle (RP/Cl°); change in forward power/change in load capacitor angle (FP/Cl°); change in reflected power/change in phase capacitor angle (RP/Cp°); and change in forward power/change in phase capacitor angle (FP/Cp°).

Note that care must be taken when mapping. Several graphs may be plotted for data on either side of the ideally tuned capacitor position for both the phase and load capacitor to then give an average of the above slopes. These slopes are than used in the following equations to determine the four tuning coefficients:

$$A = (RP/Cl°)/[\{(FP/Cl°) \times (RP/Cp°)\} - \{(FP/Cp°) \times (RP/Cl°)\}]$$

$$B = (FP/Cl°)/[\{(FP/Cl°) \times (RP/Cp°)\} - \{(FP/Cp°) \times (RP/Cl°)\}]$$

$$C = -(RP/Cp°)/\{[(FP/Cl°) \times (RP/Cp°)] - \{(FP/Cp°) \times (RP/Cl°)\}\}]$$

$$D = [(RP/Cp°) \times (FP/Cl°)]/[\{(FP/Cl°) \times (RP/Cp°) \times (RP/Cl°)\} - \{(FP/Cp°) \times (RP/Cl°) \times (RP/Cl°)\}] - [1/(RP/Cl°)]$$

The four tuning coefficients are then used in the following equation to determine the amount to move the phase and load capacitor during tuning:

Load capacitor move=$C \times$(error in forward power)+$D \times$(error in reflected power)

Phase capacitor move=$A \times$(error in forward power)−$B \times$(error in reflected power)

Where, error in forward power=actual forward power−set point forward power and error in reflected power=actual reflected power−targeted reflected power.

This concludes the description, including the preferred embodiments of the invention. The foregoing description including the preferred embodiment of the invention has been presented for the purposes of illustration and description. It is not intended to be exhaustive or to limit the invention to the precise forms disclosed. Many modifications and variations are possible within the scope of the foregoing teachings. Additional variations of the invention may be devised without departing from the inventive concept as set forth in the following claims.

What is claimed is:

1. A method of cleaning a metal surface, comprising the steps of:
   directing gas flow at atmospheric pressure comprising argon or helium and at least one molecular gas of O, N, H, F, C and S from an inlet through a laminar flow path within a housing to an outlet for plasma comprising reactive neutral species;
   directing the laminar gas flow within the housing between a surface of a powered electrode and a surface of a grounded electrode, the grounded electrode surface closely spaced from the powered electrode surface;
   delivering radio frequency power coupled to the powered electrode and the grounded electrode from a power supply to ionize species in the laminar gas flow and produce the plasma comprising the reactive neutral species; and directing the generated reactive neutral species from the outlet to the metal surface.

2. The method of claim 1, wherein the plasma is maintained at less than 100 C.

3. The method of claim 1, wherein the metal surface is cleaned by the reactive neutral species directed from the outlet.

4. The method of claim 1, wherein the metal surface is cleaned with the plasma in an oxygen free environment.

5. The method of claim 1, wherein the metal surface obtains increased surface energy by the reactive neutral species directed from the outlet.

6. The method of claim 1, wherein the metal surface comprises at least one element from the group consisting of gold, silver, copper, platinum, palladium, nickel, indium, gallium, aluminum, lead, tin, and iron.

7. The method of claim 1, wherein the housing comprises the grounded electrode.

8. The method of claim 1, wherein the flow path is formed by a flow insert disposed within a chamber within the housing, the flow insert directs the gas flow from the inlet to two opposing walls of the chamber and then to two opposite sides of the powered electrode surface.

9. The method of claim 1, wherein the powered electrode surface comprises part of a cylindrical surface and the laminar gas flow is directed circumferentially along the part of the cylindrical surface.

10. The method of claim 1, further comprising impedance matching the radio frequency power supply to the plasma using a logic algorithm that drives towards a forward power set point while minimizing reflected power as the plasma moves from strike conditions at a higher voltage to run conditions at a lower voltage.

11. The method of claim 1, wherein the molecular gas is added to the argon or helium gas flow at a concentration between 0.1 to 5.0 volume % and the molecular gas dissociates into atoms inside the plasma, and then flows out of the outlet, wherein the atoms are selected from the group consisting of O, N, H, F, C and S atoms.

12. The method of claim 1, further comprising receiving optical spectroscopy information of the plasma comprising the reactive neutral species at the outlet with an optical sensor.

13. The method of claim 12, wherein the optical spectroscopy information is reflected off a mirror at one end of the outlet.

14. The method of claim 1, further comprising heating at least one of the powered electrode and the grounded electrode as the laminar gas flow is directed between the powered electrode surface and the grounded electrode surface.

15. The method of claim 14, wherein heating comprises circulating heated liquid through a hollow space within the powered electrode.

16. The method of claim 1, wherein the gas flow comprises argon and hydrogen and metal oxide on the metal surface is removed by the reactive neutral species directed from the outlet to the metal surface.

17. The method of claim 16, wherein the plasma comprises hydrogen at a partial pressure of at least 10 Torr.

18. The method of claim 16, wherein the hydrogen is below 2.0 volume % and the argon is a balance of the gas flow.

19. The method of claim 16, herein metal oxide on the metal surface is removed by the reactive neutral species directed from the outlet.

20. The method of claim 19, wherein the metal surface is heated to increase a rate of metal oxide reduction.

* * * * *